(12) United States Patent
Lazovsky et al.

(10) Patent No.: US 8,343,866 B2
(45) Date of Patent: Jan. 1, 2013

(54) FORMATION OF A MASKING LAYER ON A DIELECTRIC REGION TO FACILITATE FORMATION OF A CAPPING LAYER ON ELECTRICALLY CONDUCTIVE REGIONS SEPARATED BY THE DIELECTRIC REGION

(75) Inventors: David E. Lazovsky, Los Gatos, CA (US); Sandra G. Malhotra, San Jose, CA (US); Thomas R. Boussie, Menlo Park, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/251,952

(22) Filed: Oct. 3, 2011

(65) Prior Publication Data
US 2012/0258595 A1 Oct. 11, 2012

Related U.S. Application Data

(63) Continuation of application No. 12/815,206, filed on Jun. 14, 2010, now Pat. No. 8,039,383.

(51) Int. Cl.
*H01L 21/44* (2006.01)
(52) U.S. Cl. . 438/597; 438/674; 438/678; 257/E21.575; 257/E21.577; 257/E21.586

(58) Field of Classification Search .................. 438/597, 438/674, 678; 257/E21.575, E21.577, E21.586
See application file for complete search history.

(56) References Cited

U.S. PATENT DOCUMENTS 6,641,899 B1 * 11/2003 Colburn et al. ............... 428/209

* cited by examiner

*Primary Examiner* — Alexander Ghyka
*Assistant Examiner* — Stanetta Isaac

(57) ABSTRACT

A masking layer is formed on a dielectric region of an electronic device so that, during subsequent formation of a capping layer on electrically conductive regions the masking layer inhibits formation of capping layer material on the dielectric region. The capping layer can be formed selectively on the electrically conductive regions or non-selectively; in either case, capping layer material formed over the dielectric region can subsequently be removed, thus ensuring that capping layer material is formed only on the electrically conductive regions. Silane-based materials, such as silane-based SAMs, can be used to form the masking layer. The capping layer can be formed of an electrically conductive, a semiconductor material, or an electrically insulative material, and can be formed using any appropriate process, including conventional deposition processes such as electroless deposition, chemical vapor deposition, physical vapor deposition or atomic layer deposition.

13 Claims, 18 Drawing Sheets

FORMATION OF A MASKING LAYER ON A DIELECTRIC REGION TO FACILITATE FORMATION OF A CAPPING LAYER ON ELECTRICALLY CONDUCTIVE REGIONS SEPARATED BY THE DIELECTRIC REGION

This application is a continuation of application Ser. No. 12/815,206, filing date Jun. 14, 2010, entitled "FORMATION OF A MASKING LAYER ON A DIELECTRIC REGION TO FACILITATE FORMATION OF A CAPPING LAYER ON ELECTRICALLY CONDUCTIVE REGIONS SEPARATED BY THE DIELECTRIC REGION", which is a continuation of application Ser. No. 11/132,841, filing date May 18, 2005, entitled "FORMATION OF A MASKING LAYER ON A DIELECTRIC REGION TO FACILITATE FORMATION OF A CAPPING LAYER ON ELECTRICALLY CONDUCTIVE REGIONS SEPARATED BY THE DIELECTRIC REGION", now U.S. Pat. No. 7,7749,881, issued date Jul. 6, 2010.

BACKGROUND OF THE INVENTION

1. Field of the Invention

This invention relates to forming a capping layer on electrically conductive regions of an electronic device to inhibit electromigration in the electrically conductive regions (and, in some cases, enhance inhibition of diffusion of material from the electrically conductive regions). In particular, the invention relates to the formation of a masking layer on a dielectric region to facilitate formation of a capping layer on electrically conductive regions separated by the dielectric region.

2. Related Art

In the manufacture of various products, electrically conductive material (typically a metal, such as aluminum or copper) and dielectric material (often, a silicon dioxide-based material) are formed on, in, or as part of, a substrate such that regions of the electrically conductive material are separated by regions of dielectric material from other regions of the electrical conductive material to define electrical elements (e.g., transistors, capacitors, resistors) and electrical interconnections between electrical elements. (For convenience, a substrate including—i.e., having as part of, or having formed on or in—electrically conductive regions separated by a dielectric region is sometimes referred to herein as an Aelectronic device.@) Electronic components (microprocessors, memory chips, etc.) for computers and other devices are well-known examples of such products. Other products too, such as flat panel displays, can also be constructed in that way.

During operation of an electronic device, the flow of current through an electrical interconnection can cause electromigration (i.e., movement of atoms of an electrically conductive material as a result of current flow through the electrically conductive material) which can result in deformation of the electrical interconnection (e.g., formation of voids, hillocks and/or extrusions), in particular at interface(s) with adjacent material. Such deformation can result in undesirable current leakage or current flow inhibition. As the characteristic dimension of electrical interconnections of electronic devices becomes smaller (the manufacture of a variety of electronic devices now requires the cost-effective production of electrical interconnections having a characteristic dimension at the sub-100 nm size scale, and those required in future electronic devices will be increasingly smaller), the increased current density flowing through those electrical interconnections renders electromigration even more of a problem.

FIG. 1A is a simplified cross-sectional view of part of a semiconductor device 100, illustrating electrically conductive regions 110 separated by dielectric regions 120. (A semiconductor device is an electronic device in which the substrate is made of, in whole or in functionally significant part, a semiconductor material or materials.) The electrically conductive regions 110 and dielectric regions 120 are formed over (i.e., formed subsequent to, and through a common axis or axes perpendicular to the layers of material formed in a device) another electrically conductive region 105. The electrically conductive regions 110 can be, for example, interconnections between the electrically conductive region 105 and other electrically conductive material to be subsequently formed as part of the semiconductor device 100. In current semiconductor devices, copper is commonly used to form electrically conductive regions and a silicon dioxide-based material (e.g., FSG, SiCOH, porous SiCOH, MSQ) is commonly used to form dielectric regions. Additionally, in current semiconductor devices, the dielectric region often includes a hard mask layer (which is often formed of a silicon-based—e.g., $SiC_x$, $SiN_x$, $SiC_xN_y$—material) formed at the top (i.e., the surface of a region on which material can be formed during subsequent processing of a device after formation of the region) of the dielectric region: in FIG. 1A—and FIG. 1B, discussed below—the semiconductor device 100 is illustrated with a hard mask layer 120a formed at the top of each of the dielectric regions 120.

FIG. 1B is a simplified cross-sectional view of the part of a semiconductor device 100, illustrating a dielectric barrier layer 130 formed on the electrically conductive regions 110 and dielectric regions 120. (In FIGS. 1A and 1B, a dielectric barrier layer 106 previously formed on the electrically conductive region 105 of the semiconductor device 100 is also illustrated.) A Adielectric barrier layer@ is a layer of dielectric material in a semiconductor (or other electronic) device that is formed non-selectively on both electrically conductive regions and dielectric regions that separate those electrically conductive regions, after planarization of the top of the electrically conductive regions and dielectric regions, to inhibit diffusion of material from the electrically conductive regions into adjacent regions (in particular, into dielectric material subsequently formed over the electrically conductive regions) of the semiconductor device. (A dielectric barrier layer is also sometimes referred to as a Avia etch stop layer,@ a Adielectric cap,@ or a Acapping layer.@ Herein, the term Adielectric barrier layer@ is used; as discussed in more detail elsewhere herein, Acapping layer@ is used to refer to a different type of layer, which may, nevertheless, provide functionality associated with a dielectric barrier layer, such as inhibition of diffusion of material from electrically conductive regions.) In current semiconductor devices, compositions including silicon together with carbon and/or nitrogen (i.e., $SiC_x$, $SiN_x$, $SiC_xN_y$) are commonly used to form a dielectric barrier layer. Since these materials have a higher dielectric constant than the dielectric materials that could otherwise be used (i.e., if it was not necessary or desirable to inhibit diffusion from the electrically conductive regions), an undesirable consequence of the presence of a dielectric barrier layer is that the capacitance associated with the structure illustrated in FIG. 1B is increased, which can increase power consumption and/or decrease speed of operation of the semiconductor device. Further, current common implementations of a dielectric barrier layer do not adhere well to current common implementations of electrically conductive regions in semiconductor devices and, consequently, do little to inhibit electromigration in the electrically conductive regions, which commonly is initiated at the interface between the electrically conductive regions and the dielectric barrier layer. In view of the foregoing, there is a need for improved inhibition of electromigration in electrically conductive regions (and, in particular, at interface(s) of electrically conductive regions with adjacent regions formed of other material) of semiconductor (and other electronic) devices. There is also a need for reduction in capacitance of the structure formed in the vicinity of the electrically conductive regions of semiconductor (and other electronic) devices, while adequately maintaining a barrier to diffusion of material from the electrically conductive regions into adjacent regions formed of other material. These needs have—and will continue to—become increasingly strong as the characteristic dimension of features (e.g., electrical interconnections) in electronic devices becomes smaller.

To inhibit electromigration at the interface between electrically conductive regions and a dielectric barrier layer of a semiconductor device, a layer of material has been selectively formed on the electrically conductive regions before forming the dielectric barrier layer. (ASelective@ formation of a material on a region or surface means that the material forms on that region or surface with better coverage of the region or surface than that with which the material forms on other region(s) or surface(s).) Such a selectively formed layer can be referred to as, for example, a Acapping layer@ or a Aself-aligned barrier layer;@ herein, the former term is generally used. Selective formation of a capping layer on electrically conductive regions is illustrated in FIGS. 2A through 2C. FIG. 2A is a simplified cross-sectional view of part of a semiconductor device 200, illustrating electrically conductive regions 210 separated by a dielectric region 220. FIG. 2B is a simplified cross-sectional view of the part of a semiconductor device 200, illustrating the selective formation of a capping layer 240 on the electrically conductive regions 210, but not the dielectric region 220. FIG. 2C is a simplified cross-sectional view of the part of a semiconductor device 200, illustrating a dielectric barrier layer 230 formed on the capping layer 240 and the dielectric region 220. Several ways of selectively forming the capping layer 240 have been tried, using various materials and processes.

For example, a capping layer has been formed by selectively depositing an appropriate material on electrically conductive regions. A metallic material is often used because metallic materials have the properties necessary to catalyze growth of a layer on copper, which is commonly used to form the electrically conductive regions. For instance, electroless deposition has been used to selectively deposit a metal alloy (e.g., an alloy of cobalt, tungsten and phosphorous; an alloy of cobalt and boron; or an alloy of nickel, molybdenum and phosphorous) on copper regions. An approach of this type is described in AHigh Reliability Cu Interconnection Utilizing a Low Contamination CoWP Capping Layer,@ by T. Ishigami et al., Proceedings of the 2004 IEEE International Interconnect Technology Conference, Jun. 7-9, 2004, pp. 75-77, the disclosure of which is hereby incorporated by reference herein. Or, for instance, chemical vapor deposition has been used to selectively deposit tungsten on copper regions. An approach of this type is described in AA Robust, Deep-Submicron Copper Interconnect Structure using Self-Aligned Metal Capping Method,@ by T. Saito et al., Proceedings of the 2004 IEEE International Interconnect Technology Conference, Jun. 7-9, 2004, pp. 36-38, the disclosure of which is hereby incorporated by reference herein. However, the selectivity of these approaches is inadequate to inhibit formation of capping layer material (which is electrically conductive) on dielectric region(s) (in FIGS. 2B and 2C, a thin layer of capping layer material—not designated by a numeral in FIGS. 2B and 2C—is shown on the dielectric region 220) to an extent that prevents unacceptable current leakage between electrically conductive regions separated by those dielectric region(s) (this is particularly so as the characteristic dimension of electrical interconnections of electronic devices becomes smaller). This may be due, at least in part, because residual material from the electrically conductive regions that is left on the dielectric region(s) after planarization (e.g., chemical mechanical polishing) of the exposed surfaces of the electrically conductive regions and dielectric region(s) provides nucleation sites for the capping layer material (which is chosen for its affinity for forming on the material of the electrically conductive regions), significantly reducing preferential formation of the capping layer material on the electrically conductive regions as compared to the dielectric region(s).

A capping layer has also been formed by chemically modifying a top part of each of the electrically conductive regions. For example, a capping layer has been formed by chemically modifying the top parts of copper regions using silicidation and nitridation (this can be accomplished using wet or dry processing). An approach of this type is described in AIntegration and performance of an alternative approach using copper silicide as a self-aligned barrier for 45 nm technology node Cu interconnects,@ by L. G. Gosset et al., Proceedings of the 2004 IEEE International Interconnect Technology Conference, Jun. 7-9, 2004, pp. 15-17, the disclosure of which is hereby incorporated by reference herein. However, the capping layer formed in this way undesirably increases resistance in the electrically conductive regions.

It has also been proposed to form a layer of organic material on electrically conductive regions of a semiconductor device to inhibit electromigration at the surfaces of the electrically conductive regions. (Such an organic layer can also be referred to as a Acapping layer.@) The use of organic material, which is a very poor electrical conductor, eliminates the potential for unacceptable current leakage between electrically conductive regions resulting from the presence of the capping layer, even if the process(es) and material(s) used to form the organic layer are not particularly selective in preferentially forming the organic layer on electrically conductive regions. U.S. Patent Application Publication No. US 2004/0203192 describes such an approach in which a self-assembled organic monolayer (in particular, a thiolate self-assembled monolayer) is covalently bonded to metallic regions. However, it is believed that the thiolate self-assembled monolayers described therein may not produce, when formed on copper (as discussed above, a material commonly used to form electrically conductive regions of a semiconductor device), a thermally stable capping layer that remains continuous and defect-free (i.e., having sufficiently few defects according to one or more criteria) under operating conditions of the semiconductor device, and therefore may not adequately inhibit electromigration, or provide an adequate copper diffusion barrier that can enable elimination of the dielectric barrier layer from the semiconductor device.

SUMMARY OF THE INVENTION

According to the invention, a masking layer is formed on a dielectric region of an electronic device so that during subsequent formation of a capping layer on electrically conductive regions of the electronic device that are separated by the dielectric region, the masking layer inhibits formation of the capping layer on or in the dielectric region. Prior to formation of the masking layer, exposed surfaces of the electrically conductive regions and the exposed surface of the dielectric region can be processed in a specified manner (e.g., cleaned, functionalized). The masking layer can be formed selectively on the dielectric region so that no or negligible masking layer material is formed on the electrically conductive regions. Alternatively, the masking layer can be formed non-selectively on both the dielectric regions and the electrically conductive regions, and masking layer material formed on the electrically conductive regions subsequently removed. The capping layer can be formed selectively on the electrically conductive regions so that no or negligible capping layer material is formed on the masking layer. Alternatively, the capping layer can be formed non-selectively on both the electrically conductive regions and the masking layer, and capping layer material formed on the masking layer subsequently removed (this can be done by removing only capping layer material from the masking layer, or by removing some or all of the masking layer and, with it, capping layer material formed thereon). (If not already removed as part of removing capping layer material from over the dielectric region, the masking layer can be removed from the dielectric region after formation of the capping layer.) In either case, capping layer material is inhibited from being formed on the masking layer over the dielectric region (in addition to the inhibition of formation of capping layer material on or in the dielectric region, due to the presence of the masking layer on the dielectric region).

Consequently, unlike previous approaches to forming a capping layer in which a layer of electrically conductive material (e.g., a cobalt alloy, a nickel alloy or tungsten) is selectively formed on electrically conductive regions, the invention prevents the occurrence of unacceptable current leakage between electrically conductive regions when electrically conductive material is used to form the capping layer. Since the invention inhibits formation of capping layer material over, on or in the dielectric region, the invention enables a great deal of flexibility in the selection of material(s) and/or process(es) for forming the capping layer, without regard for the selectivity of the capping layer material for the electrically conductive regions vis-a-vis the dielectric region (and, in some embodiments, without regard for the selectivity of the capping layer material for any material). For example, the material(s) and/or process(es) used to form the capping layer can be chosen to enhance adhesion of the capping layer to the electrically conductive regions (thus improving inhibition by the capping layer of electromigration in the electrically conductive regions). The material(s) and/or process(es) used to form the capping layer can also be chosen to produce a capping layer that does not unacceptably or undesirably increase resistance in the electrically conductive regions: for example, the capping layer can be formed without replacing any of the material of the electrically conductive regions with capping layer material having a higher dielectric constant. Additionally or alternatively, the material(s) and/or process(es) used to form the capping layer can be chosen to produce a capping layer that is sufficiently effective in inhibiting diffusion of material used to form the electrically conductive regions that a dielectric barrier layer can be eliminated from the electronic device or, at least, reduced in thickness (with attendant decrease in capacitance and associated benefits). (In some embodiments of the invention, a conventional dielectric barrier layer can be formed.) Further, since the masking layer inhibits formation of capping layer material in the dielectric region, the invention facilitates the use of porous dielectric materials that are increasingly deemed desirable for use in electronic devices. Additionally, unlike the above-described approach in which a capping layer is produced by forming a thiolate self-assembled monolayer, the invention enables production of a thermally stable capping layer on copper (a material commonly used to form electrically conductive regions of electronic devices) that remains continuous and defect-free under typical operating conditions of many electronic devices.

The masking layer can be, for example, a molecularly self-assembled layer, which can be formed as a monolayer (SAM) or a multilayer, and can be formed of organic and/or inorganic material. The masking layer can also be, for example, a layer formed from any class of materials known to form with controlled film thickness, such as, for instance, multi-layer polyelectrolytes. The masking layer can also be, for example, a layer formed on the surface of the dielectric region through the catalytic growth of inorganic or organic materials, such as polymer brushes. The masking layer can also be, for example, a layer formed from dendrimers, hyper-branched polymers, or block co-polymers. The masking layer can also be, for example, an ionic or electrochemically-enhanced self-assembled multilayer or monolayer. In particular, silane-based materials can be used to form the masking layer in an embodiment of the invention.

The capping layer can be formed of an electrically conductive material (e.g., a cobalt alloy, a nickel alloy, tungsten, tantalum, tantalum nitride), a semiconductor material, or an electrically insulative material. The capping layer can be formed using any appropriate process, including conventional deposition processes such as electroless deposition, chemical vapor deposition, physical vapor deposition (sputtering) or atomic layer deposition.

The invention can be implemented in, or used to process, a substrate made of any type of material. In particular, the invention can advantageously be implemented in, or used to process, a semiconductor substrate, such as, for example, a silicon substrate, silicon-on-insulator substrate, silicon carbide substrate, strained silicon substrate, silicon germanium substrate or gallium arsenide substrate. The invention can be implemented in, or used to process, a substrate including electrically conductive regions formed using any type of electrically conductive material, such as copper or aluminum. The invention can be implemented in, or used to process, a substrate including a dielectric region made of any type of electrically insulative material, including non-porous and porous dielectric materials, and which may or may not include a hard mask layer.

DETAILED DESCRIPTION OF THE INVENTION

Figure 1A:
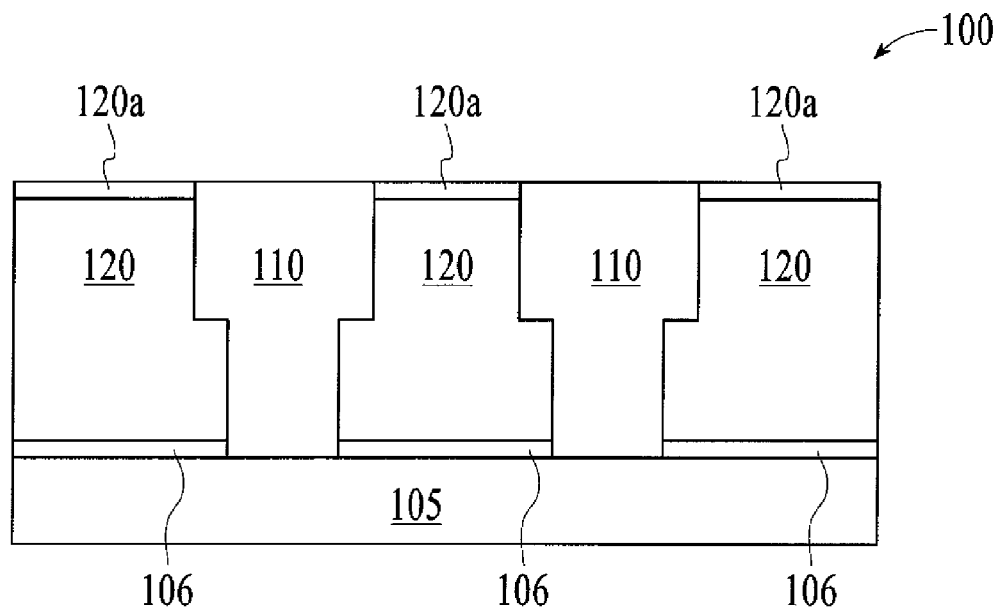
FIG. 1A is a simplified cross-sectional view of part of a semiconductor device, illustrating electrically conductive regions separated by dielectric regions.
Figure 1B:
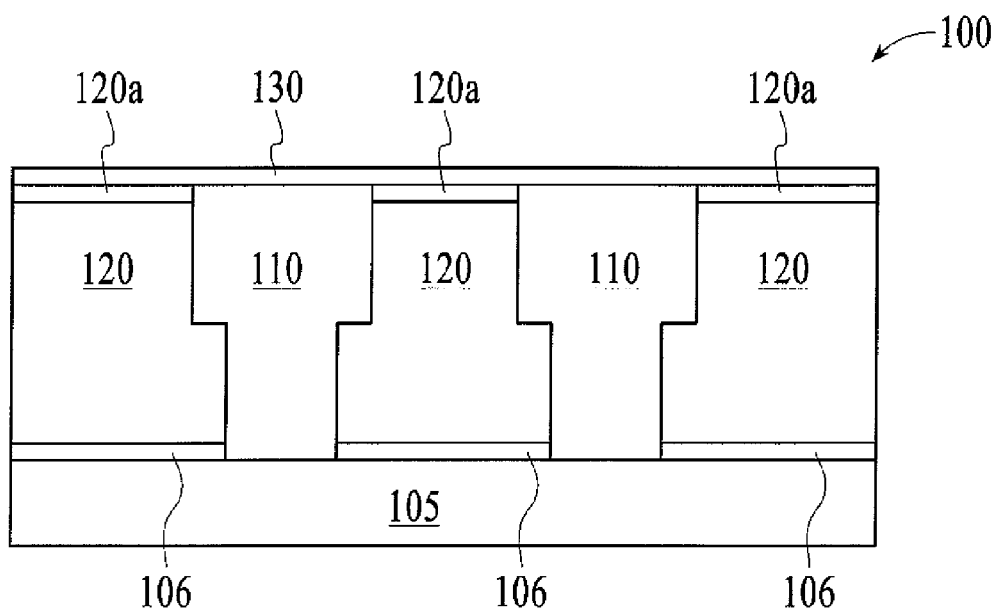
FIG. 1B is a simplified cross-sectional view of the part of a semiconductor device of FIG. 1A, illustrating a dielectric barrier layer formed on the electrically conductive regions and dielectric regions.
Figure 2A:
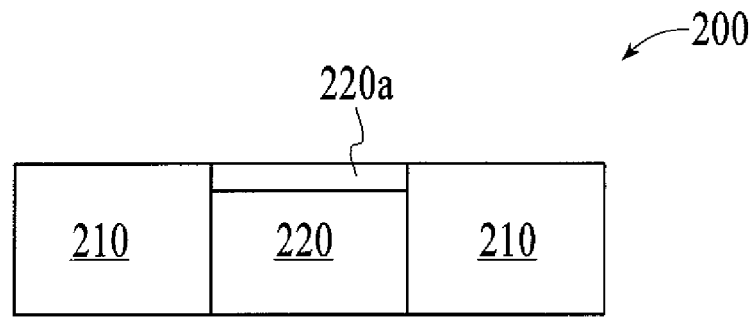
FIG. 2A is a simplified cross-sectional view of part of a semiconductor device, illustrating electrically conductive regions separated by a dielectric region.
Figure 2B:
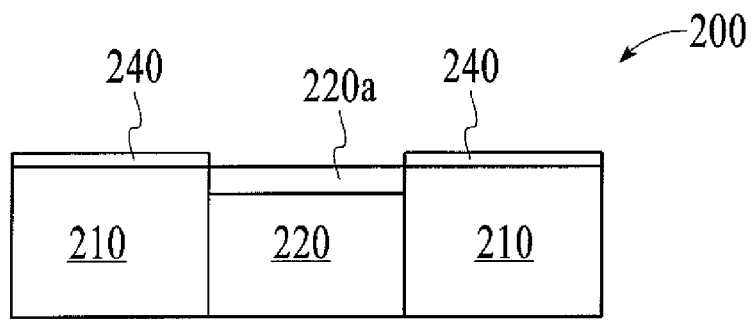
FIG. 2B is a simplified cross-sectional view of the part of a semiconductor device of FIG. 2A, illustrating the selective formation of a capping layer on the exposed surfaces of the electrically conductive regions, but not the exposed surface of the dielectric region.
Figure 2C:
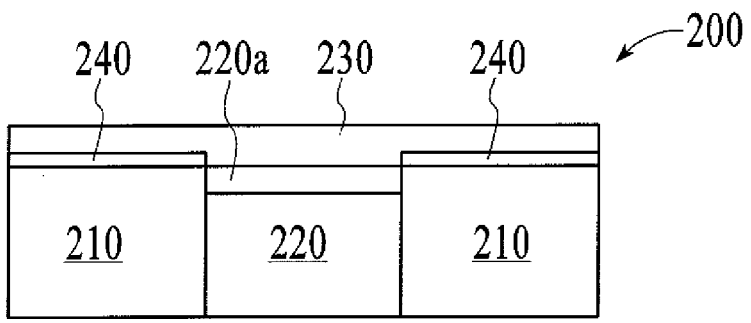
FIG. 2C is a simplified cross-sectional view of the part of a semiconductor device of FIGS. 2A and 2B, illustrating a dielectric barrier layer formed on the capping layer and the exposed surface of the dielectric region.

According to the invention, on a substrate including (i.e., having as part of, or having formed on or in) electrically conductive regions separated by a dielectric region (as indicated above, for convenience, such a substrate is sometimes referred to herein as an Aelectronic device@), a masking layer is formed on the dielectric region so that, during subsequent formation of a capping layer on the substrate, the masking layer inhibits formation of capping layer material on or in the dielectric region. (In practice, an electronic device will typically include many such electrically conductive regions and dielectric regions.) The electrically conductive regions can be electrical interconnections between electrical elements (e.g., transistors, capacitors, resistors) of the electronic device, and it is anticipated that the invention will commonly be used in producing a capping layer on such electrical interconnections. The masking layer can be formed selectively on the dielectric region so that no or negligible masking layer material is formed on the electrically conductive regions. Alternatively, the masking layer can be formed non-selectively on both the dielectric regions and the electrically conductive regions, and masking layer material formed on the electrically conductive regions subsequently removed. As used herein, a Acapping layer@ (also sometimes referred to as a Aself-aligned barrier layer@) is a layer of material formed on electrically conductive regions of an electronic device, typically after planarization of the top of the electrically conductive regions, to inhibit electromigration in the electrically conductive regions and, in particular, to inhibit electromigration in the electrically conductive regions better than a dielectric barrier layer (discussed above) that would otherwise be formed on the electrically conductive regions. (Additionally, in some cases, as discussed in more detail below, a capping layer may inhibit diffusion of material from the electrically conductive regions and, in particular, may inhibit such diffusion to an extent that enables elimination, or reduction of the thickness, of a dielectric barrier layer that would otherwise be formed on the capping layer.) The capping layer can be formed selectively on the electrically conductive regions so that no or negligible capping layer material is formed on the masking layer: in particular, the material(s) and/or process(es) used to form the masking layer and/or the capping layer can be tailored to inhibit formation of capping layer material on the masking layer, thus fostering the selective formation of the capping layer on the electrically conductive regions. Alternatively, the capping layer can be formed non-selectively on both the electrically conductive regions and the masking layer, and capping layer material formed on the masking layer subsequently removed (this can be done, for example, by removing some or all of the masking layer and, with it, capping layer material formed thereon). (The foregoing alternatives encompass forming the masking layer or capping layer with any degree of selectivity. As indicated above, Aselective@ formation of a material on a region or surface means that the material forms on that region or surface with better coverage of the region or surface than that with which the material forms on other region(s) or surface(s). In any embodiment of the invention, masking layer material formed on electrically conductive regions or capping layer material formed on the masking layer can be removed if deemed necessary or desirable. However, as discussed further below, removal of masking layer material formed on electrically conductive regions or capping layer material formed on the masking layer may not be necessary in some cases, e.g., when negligible amounts of masking layer material are formed on electrically conductive regions or negligible amounts of capping layer material are formed on the masking layer, such as may be the case when the masking layer or capping layer, respectively, is formed selectively on the electrically conductive regions.) In either case, capping layer material is inhibited from being formed on the masking layer over the dielectric region (in addition to the inhibition of formation of capping layer material on or in the dielectric region, due to the presence of the masking layer on the dielectric region). Consequently, unlike previous approaches to forming a capping layer in which a layer of electrically conductive material (e.g., a cobalt alloy, nickel alloy or tungsten) is selectively deposited on electrically conductive regions, the invention prevents the occurrence of unacceptable current leakage between electrically conductive regions when electrically conductive material is used to form the capping layer. Since the invention inhibits formation of capping layer material over, on or in the dielectric region, the invention enables a great deal of flexibility in the selection of material(s) and/or process(es) for forming the capping layer, without regard for the selectivity of the capping layer material for the electrically conductive regions vis-a-vis the dielectric region (and, in some embodiments, without regard for the selectivity of the capping layer material for any material): this can enable, for example, the use of material(s) and/or process(es) in formation of the capping layer that would otherwise not form the capping layer with sufficient selectivity, such as those described above in the Background section. For example, the material(s) and/or process(es) used to form the capping layer can be chosen to enhance adhesion of the capping layer to the electrically conductive regions (thus improving inhibition by the capping layer of electromigration in the electrically conductive regions). The material(s) and/or process(es) used to form the capping layer can also be chosen to produce a capping layer that does not unacceptably or undesirably increase resistance in the electrically conductive regions; for example, the capping layer can be formed without replacing any of the material of the electrically conductive regions with capping layer material having a higher dielectric constant. Additionally or alternatively, the material(s) and/or process(es) used to form the capping layer can be chosen to produce a capping layer that is sufficiently effective in inhibiting diffusion of material used to form the electrically conductive regions (e.g., copper) that a dielectric barrier layer can be eliminated from the electronic device or, at least, reduced in thickness (with attendant decrease in capacitance and associated benefits). Further, since the masking layer inhibits formation of capping layer material in the dielectric region, the invention facilitates the use of porous dielectric materials that are increasingly deemed desirable for use in electronic devices. Additionally, unlike the above-described approach in which a capping layer is produced by forming a thiolate self-assembled monolayer, the invention enables production of a thermally stable capping layer (e.g., using any of the above-described processes for selectively forming a capping layer by selectively depositing a metallic material) on copper (a material commonly used to form electrically conductive regions of semiconductor devices, as well as other electronic devices) that remains continuous and defect-free (i.e., having sufficiently few defects according to one or more criteria) under typical operating conditions of many electronic devices (e.g., for semiconductor devices, this means that the capping layer should be able to withstand temperatures up to about 450EC).

The invention can be used in the processing of a substrate made of any type(s) of material. This is particularly so since, as described in more detail below, the invention can be implemented so that substrate material (e.g., a dielectric region) is functionalized to have desired properties, such as desired adhesion. (As used herein, and as known to those skilled in the chemical arts, Afunctionalization@ of a material refers to modifying the characteristics of an exposed part of the material to achieve a desired interaction with another material subsequently formed on the exposed part of the material.) In particular, the invention can advantageously be used in the processing of a semiconductor substrate as is commonly done in the manufacture of components for use in the electronics industry. The invention can also be used in the processing of a substrate for use in the production of a flat panel display, which substrates are now commonly made of silicon. The invention can be used in the processing of any type of semiconductor substrate, such as, for example, a silicon substrate, silicon-on-insulator substrate, silicon carbide substrate, strained silicon substrate, silicon germanium substrate or gallium arsenide substrate.

Further, the invention can be used in the processing of a substrate of any shape or size. For example, the invention can be used in the processing of semiconductor substrates used in the production of electronic components, which substrates are typically circular, as well as in the processing of substrates used in the production of flat panel displays, which substrates are typically rectangular. The invention can be used in the processing of small semiconductor substrates having areas of less than 1 in.$^2$ up to the 12 inch (300 mm) semiconductor substrates currently used in the production of many electronic components; in general, there is no limit to the size of substrate that can be processed, so that the invention can be used to process each succeeding larger generation of semiconductor substrates used to produce electronic components. The invention can also be used to process the relatively large substrates that are used in the production of flat panel displays (now, commonly rectangular substrates on the order of about 1 m$^2$, but, in some cases, larger, and expected to increase in size in the future). The invention can also be scaled for use in roll-to-roll processing applications for flexible substrates having a fixed width, but (theoretically) unlimited length (a manner of substrate processing that can be particularly useful in the production of flat panel displays); for example, such substrate rolls can be hundreds of feet long.

The invention can be used in processing electronic devices including electrically conductive regions and dielectric regions of any type of material. This is particularly so since the masking layer (and, in some cases, the electrically conductive regions and dielectric regions) can be functionalized to have desired properties, such as desired adhesion and/or diffusion barrier properties. In semiconductor devices used in the production of electronic components, for example, the electrically conductive regions are often made of copper or aluminum; the invention can readily be used in processing such substrates. A variety of dielectric materials (e.g., SiCOH dielectric materials, including porous SiCOH dielectric materials) are used to form dielectric regions of semiconductor devices used in the production of electronic components and the invention is compatible for use with all. In many semiconductor devices, a hard mask layer (which is often formed of a silicon-based—e.g., $SiC_x$, $SiN_x$, $SiC_xN_y$—material) is formed on top of a dielectric material of which the dielectric region is primarily composed; the invention can also readily be used in the production of an electronic device using such substrates.

Increasingly, it is becoming desirable to use porous dielectric materials in electronic devices (which may or may not have a hard mask layer formed thereon), particularly semiconductor devices used in the production of electronic components. A porous material—in this context, a porous dielectric material—is particularly susceptible to diffusion of other material therein. For example, a dielectric region made of a porous dielectric material is particularly susceptible to diffusion therein of capping layer material; especially when the capping layer material is a metallic material, as is often the case (as discussed above), diffusion of capping layer material into a dielectric region increases the likelihood of unacceptable current leakage. Additionally, as described above, residual material from electrically conductive regions that is left on a dielectric region after planarization (e.g., chemical mechanical polishing) of the exposed surfaces of the electrically conductive regions and dielectric region can provide nucleation sites for the capping layer material, thus significantly reducing preferential formation of the capping layer material on the electrically conductive regions during formation of a capping layer. A dielectric region made of a porous dielectric material is particularly susceptible to diffusion therein of such residual material, thus exacerbating this problem. Thus, use of the invention in processing substrates including dielectric regions made of porous dielectric material is particularly advantageous because the masking layer inhibits diffusion of material into the porous dielectric material.

Figure 3:
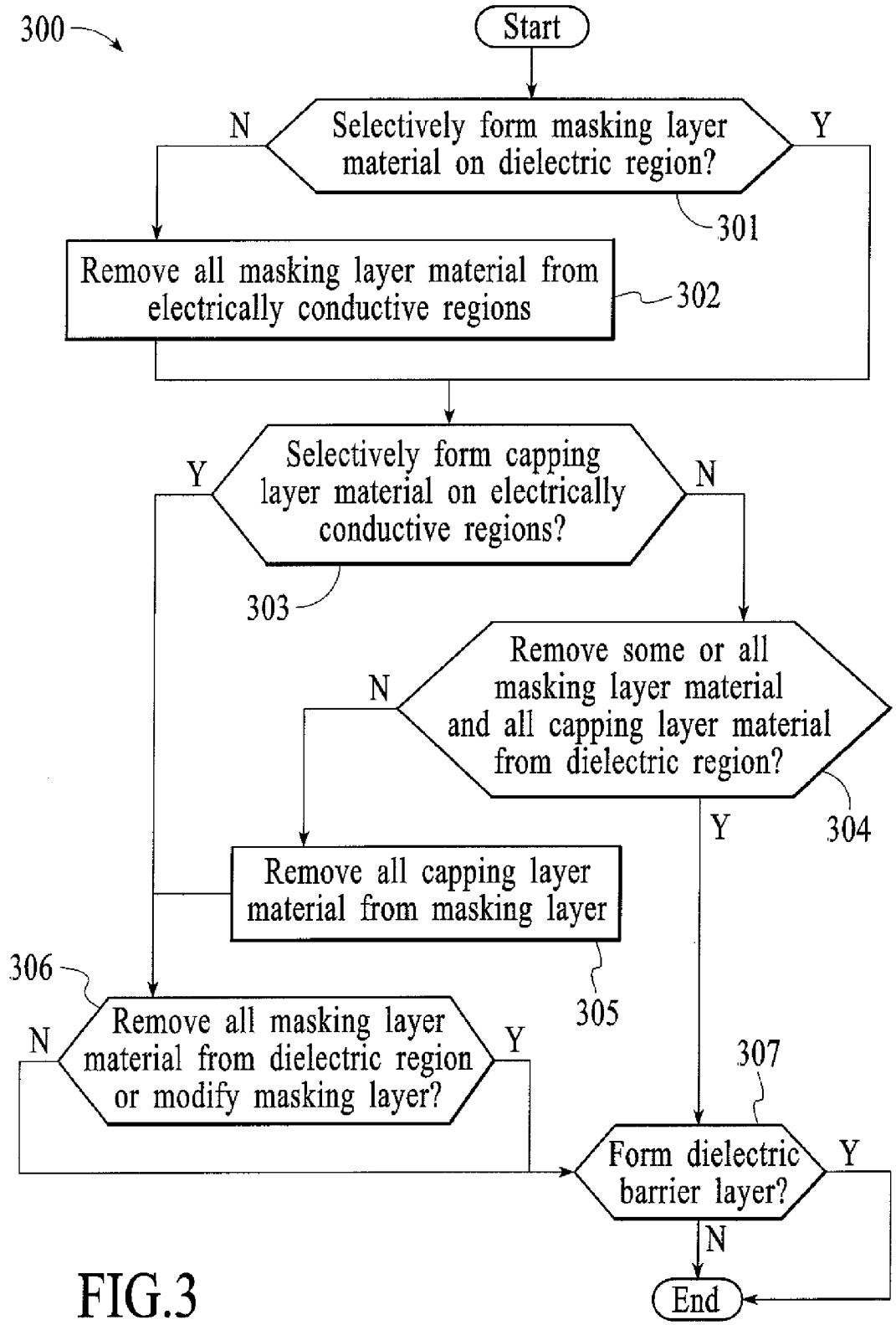
FIG. 3 is a flow chart of a method, according to an embodiment of the invention, for producing a capping layer on electrically conductive regions of an electronic device that are separated by a dielectric region.

FIG. 3 is a flow chart of a method 300, according to an embodiment of the invention, for producing a capping layer on electrically conductive regions of an electronic device that are separated by a dielectric region. In steps 301 and 302 of the method 300, a masking layer is formed on the electronic device so that the masking layer is formed on the dielectric region, but not the electrically conductive regions. In steps 303 through 306 of the method 300, after formation of the masking layer, a capping layer is formed on the electronic device so that the capping layer is formed on the electrically conductive regions, but not on or in the dielectric region or the masking layer. The presence of the masking layer inhibits formation of capping layer material on or in the dielectric region that may otherwise have occurred if the masking layer was not present, with attendant benefits as described in more detail elsewhere herein. Further, steps of the method 300 can be implemented in any of several ways, discussed in more detail below, to inhibit formation of capping layer material on or in the masking layer. Consequently, the method 300 produces a capping layer so that capping layer material is formed only on the electrically conductive regions (no or negligible capping layer material is formed over, on or in a dielectric region separating electrically conductive regions), eliminating unacceptable current leakage between electrically conductive regions that has been a problem with previous approaches to depositing a metallic capping layer that have not achieved sufficient selectivity in forming capping layer material on the electrically conductive regions in preference for a dielectric regions separating the electrically conductive regions. In step 307 of the method 300, a dielectric barrier layer can be formed on the electronic device or not, depending on the properties of the capping layer, as discussed further below. Particular ways of implementing, modifications to, and other aspects of, the method 300 are described in more detail below.

FIGS. 4A through 4E, 5A through 5D, 6A through 6D, 7A through 7C, 8A through 8E, 9A through 9D, 10A through 10F, 11A through 11E, 12A through 12E, and 13A through 13D are each sets of simplified cross-sectional views of a part of an electronic device, illustrating the production, in accordance with various embodiments of the invention, of a capping layer 440 over electrically conductive regions 410 of the electronic device that are separated by a dielectric region 420. The electrically conductive regions 410 can be interconnections between electrical elements of the electronic device, such as, for example, transistors, capacitors and resistors. The dielectric region 420 is illustrated with a hard mask layer 420a formed as a top part of the dielectric region 420, as is commonly the case in current electronic devices; however, the dielectric region 420 need not necessarily include the hard mask layer 420a. As discussed further below, the method 300 can be used in producing a capping layer in accordance with each of the embodiments of the invention illustrated by those sets of simplified cross-sectional views of a part of an electronic device. However, the method 300 can also produce a capping layer in accordance with embodiments of the invention that are different from those illustrated in FIGS. 4A through 4E, 5A through 5D, 6A through 6D, 7A through 7C, 8A through 8E, 9A through 9D, 10A through 10F, 11A through 11E, 12A through 12E, and 13A through 13D. In particular, in the embodiments of the invention illustrated in FIGS. 4A through 4E, 5A through 5D, 6A through 6D, 7A through 7C, 8A through 8E, 9A through 9D, 10A through 10F, 11A through 11E, 12A through 12E, and 13A through 13D, due to imperfect selectivity or non-selectivity of the formation of the masking layer 450, masking layer material can be formed on the electrically conductive regions 410 (as illustrated in FIGS. 4A, 5A, 6A, 7A, 8A, 9A, 10A, 11A, 12A and 13A) that is subsequently removed (as illustrated in FIGS. 4B, 5B, 6B, 7B, 8B, 9B, 10B, 11B, 12B and 13B) prior to forming the capping layer 440. However, the formation of the masking layer 450 may also be accomplished with greater selectivity so that no masking layer material is formed on the electrically conductive regions 410 (in that case, the intermediate structure illustrated in FIGS. 4A, 5A, 6A, 7A, 8A, 9A, 10A, 11A, 12A and 13A would not occur) or so that a negligible amount of masking layer material is formed on the electrically conductive regions 410 that need not necessarily be removed from the electrically conductive regions 410 (in that case, the intermediate structure illustrated in FIGS. 4B, 5B, 6B, 7B, 8B, 9B, 10B, 11B, 12B and 13B would not occur and the subsequently formed structures illustrated in further figures of each set of simplified cross-sectional views of a part of an electronic device would include the negligible amount of masking layer material formed on the electrically conductive regions 410).

Prior to forming a masking layer in accordance with the invention, the exposed surfaces of the electrically conductive regions and the exposed surface of the dielectric region are prepared for processing in accordance with the invention. This surface preparation entails at least one or more cleaning steps (e.g., a deionized water rinse and/or any of a variety of other well-known surface cleaning step(s)) to remove contaminants left from previous processing. (Such cleaning may remove some, but typically would not remove all, residual electrically conductive material left on a dielectric region after planarization of the exposed surfaces of the electrically conductive regions and dielectric region, and does not, therefore, negate the efficacy of the invention in preventing such residual electrically conductive material from promoting undesired nucleation of capping layer material on the dielectric region, as discussed elsewhere herein.) The surface preparation can include other processing steps as well. For example, the exposed surfaces of the electrically conductive regions and/or the exposed surface of the dielectric region can be functionalized to facilitate selective formation of the masking layer: in particular, the surface of the dielectric region can be functionalized to promote formation of the masking layer and the exposed surfaces of the electrically conductive regions can be functionalized to inhibit formation of the masking layer. Similarly, the exposed surfaces of the electrically conductive regions and/or the exposed surface of the dielectric region can also be functionalized to facilitate selective formation of the capping layer: in particular, the surface of the dielectric region can be functionalized to inhibit formation of the capping layer (though the use of a masking layer in accordance with the invention may render this unnecessary or, at least, of greatly reduced importance) and the exposed surfaces of the electrically conductive regions can be functionalized to promote adhesion of the capping layer. In general, the particular manner in which the surfaces of the electrically conductive regions and/or the surface of the dielectric region are functionalized depends on the nature of the materials used to form the electrically conductive regions, the dielectric region and the masking layer, and the desired propert(ies) (e.g., passivation, promotion of material formation) to be produced. For example, a dielectric region formed of a silicon dioxide-based dielectric material can be functionalized to produce a large number of hydroxyl groups at the surface of the dielectric region, to which a self-assembled monolayer (which can embody the masking layer) has an affinity for attachment, thus promoting formation of the masking layer on the dielectric region. Additionally, a molecule used to form a molecularly self-assembled layer can be established to include a head group that covalently bonds with an exposed hydroxyl group of the material used to form a dielectric region. Though not shown in FIG. 3, such surface preparation can be included as additional step(s) in the method 300 in accordance with particular embodiment(s) of the invention.

As indicated above, in steps 301 and 302 of the method 300, a masking layer is formed on an electronic device so that the masking layer is formed on a dielectric region of the electronic device, but not on the electrically conductive regions of the electronic device that are separated by the dielectric region. (Formation of a masking layer on a dielectric region encompasses negligible failure of the masking layer material to cover the dielectric region, i.e., masking layer material coverage failure that does not impair performance of a method according to the invention or the functionality of an electronic device in the production of which a method according to the invention is used. Additionally, no formation of a masking layer on electrically conductive regions encompasses negligible formation of masking layer material on the electrically conductive regions, i.e., masking layer material coverage that does not impair performance of a method according to the invention or the functionality of an electronic device in the production of which a method according to the invention is used.) As indicated by step 301, the masking layer can be formed selectively on the dielectric region or the masking layer can be formed non-selectively on both the dielectric region and the electrically conductive regions. (Selective formation of a masking layer on a dielectric region encompasses negligible formation of masking layer material on the electrically conductive regions, i.e., masking layer material coverage that does not impair performance of a method according to the invention or the functionality of an electronic device in the production of which a method according to the invention is used. Non-selective formation of a masking layer on both the dielectric region and the electrically conductive regions encompasses formation of the masking layer with no preference for the dielectric region or electrically conductive regions, with some degree of preference for the electrically conductive regions, or with preference for the dielectric region that is inadequate to result in the formation of no or negligible masking layer material on the electrically conductive regions, i.e., in the last case, with preference that is inadequate to constitute selective formation of the masking layer on the dielectric region.) When the masking layer is formed non-selectively on both the dielectric region and the electrically conductive regions, all masking layer material formed on the electrically conductive regions is subsequently removed, as indicated by step 302. (Removal of all masking layer material formed on the electrically conductive regions encompasses leaving negligible masking layer material formed on the electrically conductive regions, i.e., masking layer material coverage that does not impair performance of a method according to the invention or the functionality of an electronic device in the production of which a method according to the invention is used.) Each of FIGS. 4A and 4B, 5A and 5B, 6A and 6B, 7A and 7B, 8A and 8B, 9A and 9B, 10A and 10B, 11A and 11B, 12A and 12B, and 13A and 13B illustrate non-selective formation of a masking layer 450 on both the dielectric region 420 and the electrically conductive regions 410, followed by removal of all masking layer material formed on the electrically conductive regions 410, leaving the masking layer 450 formed only on the dielectric region 420.

In general, the masking layer can be formed using any material(s) and process(es) that produce a masking layer that achieves desired functions of the masking layer, e.g., selective formation on a dielectric region, provision of a good barrier to diffusion of capping layer material. The masking layer can be formed using either wet processing (e.g., immersion of a substrate in a chemical bath, spraying or spinning of chemical fluid on to a substrate) or dry processing (e.g., vapor deposition). If wet processing is used, typically a rinsing process is used afterwards to clean the electronic device, which is then followed by a drying process. Additionally, if wet processing is used, vibration of specified amplitude and/or frequency (e.g., high frequency vibration, such as ultrasonic or megasonic vibration) can be imparted to the electronic device during the processing to facilitate (e.g., speed up) the processing. The masking layer can be deposited or grown on the dielectric region. The masking layer can also be formed by stamping. It is anticipated that it will often be desirable to form the masking layer of an electrically insulative (effectively non-conductive) material, since the masking layer is formed in regions that, in the finished electronic device, must be electrically non-conductive. However, in embodiments of the invention in which the masking layer is completely removed from the electronic device (see, e.g., FIGS. 4D, 5D, 8D, 9D, 10E and 11E), the masking layer can be formed of an electrically conductive or semiconductor material. The use of such materials may be desirable, notwithstanding the potential problems that may result from their electrical conductivity, if the use of such materials provides other beneficial properties of a masking layer, e.g., selective formation of the masking layer on the dielectric region, good barrier to diffusion of the capping layer material. After formation of the masking layer, the masking layer can be functionalized or otherwise modified (e.g., chemically, thermally and/or photo-chemically modified) in a desired manner to produce desired properties (e.g., to produce a desired propensity for formation on the masking layer of material to subsequently be formed on the electronic device, such as a capping layer or a dielectric barrier layer, or to enable some or all of the masking layer to be removed after formation of the capping layer so that capping layer material formed on the masking layer can be removed).

The masking layer can be, for example, a molecularly self-assembled layer, which can be formed as a monolayer (SAM) or a multilayer, and can be formed of organic and/or inorganic material. A molecularly self-assembled layer can be produced by forming (e.g., depositing or growing) additional material on the surface of the dielectric region, or by chemically activating or modifying the material of the dielectric region to produce a new distinct layer of material. The ability to tailor the molecule type, head group, terminal group and/or chain length of a molecularly self-assembled layer advantageously provides flexibility in establishing the characteristics of a masking layer, which can be used to produce desired masking layer properties, as discussed elsewhere herein. The masking layer can also be, for example, a layer formed from any class of materials known to form with controlled film thickness, such as, for instance, multi-layer polyelectrolytes. The masking layer can also be, for example, a layer formed on the surface of the dielectric region through the catalytic growth of inorganic or organic materials. One example of this approach is the growth of polymer brushes from surface-initiated polymerization reactions. The surface initiators can be present in the material of the dielectric region or attached to the surface of the dielectric region through chemical or physioadsorptive means. The masking layer can also be, for example, a layer formed from dendrimers, hyperbranched polymers, or block co-polymers. The masking layer can also be, for example, an ionic or electrochemically-enhanced self-assembled multilayer or monolayer.

Silane-based materials can be used to form a masking layer in embodiments of the invention. For example, some silane-based SAMs advantageously have relatively high breakdown temperatures, which may be desirable if the masking layer is not removed by subsequent processing of the electronic device, so that the masking layer will not experience failure during operation of the electronic device that produces high temperatures in the electronic device. Additionally, as discussed in more detail below, some silane-based SAMs adhere well to (form strong covalent bonds with) silicon-based dielectric materials (of which the dielectric region is commonly formed) and do not adhere well to metallic materials such as copper (of which the electrically conductive regions are commonly formed), which can make them desirable for use in some applications of the invention because they facilitate the selective formation of the masking layer. Further, as also discussed in more detail below, silane-based SAMs can be tailored to facilitate removal of the SAM from a dielectric region, which can be useful in embodiments of the invention in which the masking layer is removed from the dielectric region. Additionally, as also discussed in more detail below, silane-based SAMs can be tailored to promote or inhibit the formation of particular material thereon, which can be useful in inhibiting formation of capping layer material on a masking layer and/or promoting adhesion of a dielectric barrier layer formed on a masking layer.

The characteristics of a masking layer formed in an embodiment of the invention can be established to produce desired properties of the masking layer. For example, the type of molecule(s) used to form a molecularly self-assembled layer can be chosen, and the characteristics of the molecule, such as the head group, terminal group and/or length (e.g., the number of carbon atoms in the organic backbone of a molecule), can be established, to produce desired properties of the molecularly self-assembled layer. The particular manner in which the characteristics of a masking layer are tailored (in turn, the material(s) and/or process(es) used to form the masking layer) can—and, it is anticipated, typically will—depend on the particular application of the invention, e.g., the properties of the dielectric region (including, in particular, the adhesion properties of the dielectric region), the necessity or desirability of avoiding formation of masking layer material on the electrically conductive regions (which can make important the adhesion properties of the electrically conductive regions), the characteristics of the material(s) and/or process(es) used to form the capping layer (in particular, the propensity of the capping layer material for formation on, and/or diffusion into, the masking layer), and/or the characteristics of the material(s) (e.g., dielectric barrier layer, such as a silicon carbide layer or a silicon nitride layer) and/or process(es) used to subsequently form material on the masking layer.

For example, the material(s) and/or process(es) used to form the masking layer can be established to facilitate achievement of one or more of the following possibly desirable properties of a masking layer produced by a method, or part of a structure, in accordance with an embodiment of the invention. It can be desirable to use material(s) and/or process (es) that produce a masking layer with high selectivity for the dielectric region (i.e., that form better on the dielectric region than on the electrically conductive regions). In some electronic devices, a SiCOH dielectric material is used; consequently, in some embodiments of the invention, it can be desirable that the invention be implemented using material(s) and/or process(es) that can be used to form a masking layer with high selectivity for a SiCOH dielectric material. Or, in some electronic devices, a silicon-based hard mask layer is formed on top of a dielectric material of which the dielectric region is primarily composed; consequently, in some embodiments of the invention, it can be desirable that the invention be implemented using material(s) and/or process(es) that can be used to form a masking layer with high selectivity for a silicon-based hard mask layer. It can be desirable to use material(s) and/or process(es) that produce a masking layer that can adhere well to a dielectric barrier layer (commonly formed of a composition including silicon together with carbon and/or nitrogen, i.e., $SiC_x$, $SiN_x$, $SiC_xN_y$) or other material to be subsequently formed on the masking layer. It can be desirable to use material(s) and/or process(es) that produce a masking layer that provides a good barrier to diffusion of the capping layer material (e.g., a cobalt alloy, such as a cobalt-tungsten-phosphorous alloy), both during production of the capping layer and during operation of the finished electronic device (if the masking layer is left as part of the finished electronic device). It can be desirable to use material(s) and/or process(es) that produce a masking layer that facilitates removal of some or all of the masking layer (and, with it, any capping layer material that may have been formed thereon), e.g., that produce a terminal group of a molecularly self-assembled layer that can be cleaved from the rest of the molecularly self-assembled layer or that produce an organic backbone of a molecularly self-assembled layer that can be broken down and removed. It can be desirable to use material (s) and/or process(es) that can produce a masking layer that is continuous and defect-free and that, if to be left as part of the electronic device, remains so even when subjected to the thermal and chemical environment associated with further processing to produce the electronic device and/or operation of the finished electronic device. For semiconductor devices, this means, for example, that the masking layer should be able to withstand temperatures up to about 450EC. This also means, for example, that the masking layer should be chemically compatible with the materials and processes used to produce the capping layer and (if present) the dielectric barrier layer. It can also be desirable to use material(s) and/or process(es) that enable rapid (e.g., less than about 60 seconds) production of a masking layer. Ways of implementing the invention to produce such properties of a masking layer are described in more detail elsewhere herein.

The characteristics of the masking layer can be established (i.e., appropriate material(s) and/or process(es) used) to produce desired material formation properties with respect to the dielectric region and the electrically conductive regions. For example, the characteristics of the masking layer can be established so that the masking layer forms selectively on the dielectric region in preference for formation on the electrically conductive regions. (However, as discussed elsewhere herein, the invention can also be implemented so that the formation of the masking layer is not selective; in that case, masking layer material formed on electrically conductive regions can be removed in a subsequent processing step, as described further below.) In this regard, the invention can take advantage of the fact that, for some materials used to form electrically conductive regions on an electronic device (e.g., copper), few materials adhere well to the electrically conductive regions, providing greater flexibility in selecting material(s) and/or process(es) for selectively forming the masking layer. The characteristics of the masking layer can also, additionally or alternatively, be established to facilitate removal of the masking layer from the dielectric region after formation of the capping layer.

For example, the molecule used to form a molecularly self-assembled masking layer can be specified to include a head group that is more likely to adhere to the dielectric region than to the electrically conductive regions. For instance, a molecule used to form a molecularly self-assembled layer can be specified to include a head group that covalently bonds with an exposed hydroxyl group of the dielectric region. As discussed above, some silane-based SAMs adhere well to silicon-based dielectric materials commonly used to form a dielectric region and do not adhere well to metallic materials such as copper that are commonly used to form electrically conductive regions, thus making them appropriate for use in embodiments of the invention in which the masking layer is selectively formed on the dielectric region. For example, it is known that a silane with one or more hydrolysable substituents of the general formula $R_nSiX_{4-n}$ (where R can be, for example, alkyl, substituted alkyl, aryl or substituted aryl, and X can be, for example, halo, alkoxy, aryloxy or amino) can form a SAM that can exhibit strong covalent or non-covalent attachment to particular surfaces. Typically, SAM surface attachment is enhanced on a surface having a relatively high density of acidic functionalities such as hydroxyl or hydroxysilyl groups. Silicon-based material surfaces such as $SiO_2$, SiOH and SiOC surfaces possess relatively high densities of hydroxyl groups. Thus, a silane-based SAM can be expected to form with greater adhesion to a surface of a silicon-based material (of which a dielectric region is commonly formed) than to a surface of a metallic material (of which electrically conductive regions are commonly formed).

A silane-based SAM can also be tailored to reversibly adhere to a surface depending on the nature and substitution of a silane precursor material. For example, silicon-based SAM precursors with a single hydrolysable substituent (e.g., of the general formula $R^1R^2R^3SiX$) are known to produce a SAM that can be formed on, and reversibly detached from, a functionalized surface (e.g., a surface having a relatively high density of acidic functionalities) under specific reaction conditions. For instance, a SAM can be formed on a substrate through reaction in an organic solvent medium (e.g., toluene, hexane, dichloromethane or mixtures thereof). Such a SAM can be made to be stable to aqueous solvent media over a range of pH conditions. This would allow, for example, subsequent electroless deposition of capping layer material while maintaining the integrity of the SAM. Removal of the SAM can then be accomplished through treatment with an aqueous or mixed organic/aqueous solution at elevated pH (e.g. $NaOH/MeOH/H_2O$ at pH 12). Thus, the adhesion properties of a silane-based SAM can be controlled to facilitate attachment to a dielectric region, then removal from the dielectric region after formation of the capping layer. Silanization of surfaces is discussed in detail in, for example, *Silanes, Surfaces and Interfaces* (*Chemically Modified Surfaces, Vol. 1*), edited by Donald E. Leyden, Gordon & Breach Science Publishers, 1986, the disclosure of which is hereby incorporated by reference herein; principles discussed therein can be used in implementing aspects of the invention, as can be appreciated in view of the description elsewhere herein of the use of silane-based materials in implementing aspects of the invention.

The characteristics of the masking layer can also be established (i.e., appropriate material(s) and/or process(es) used) to produce desired material formation and/or adhesion properties with respect to material to be formed on the electronic device subsequent to formation of the masking layer. In particular, the characteristics of the masking layer can be established so that capping layer material does not form well on the masking layer, thus facilitating selective formation of the capping layer on the electrically conductive regions. (However, as discussed elsewhere herein, the invention can also be implemented so that the formation of the capping layer is not selective; in that case, capping layer material formed on the masking layer can be removed in a subsequent processing step, as described further below, and the desirability of establishing the characteristics of the masking layer to inhibit formation of capping layer material on the masking layer is generally diminished.) The characteristics of the masking layer can also be established so that dielectric barrier layer material (if a dielectric barrier layer is to be formed) adheres well to the masking layer.

Figure 14A:
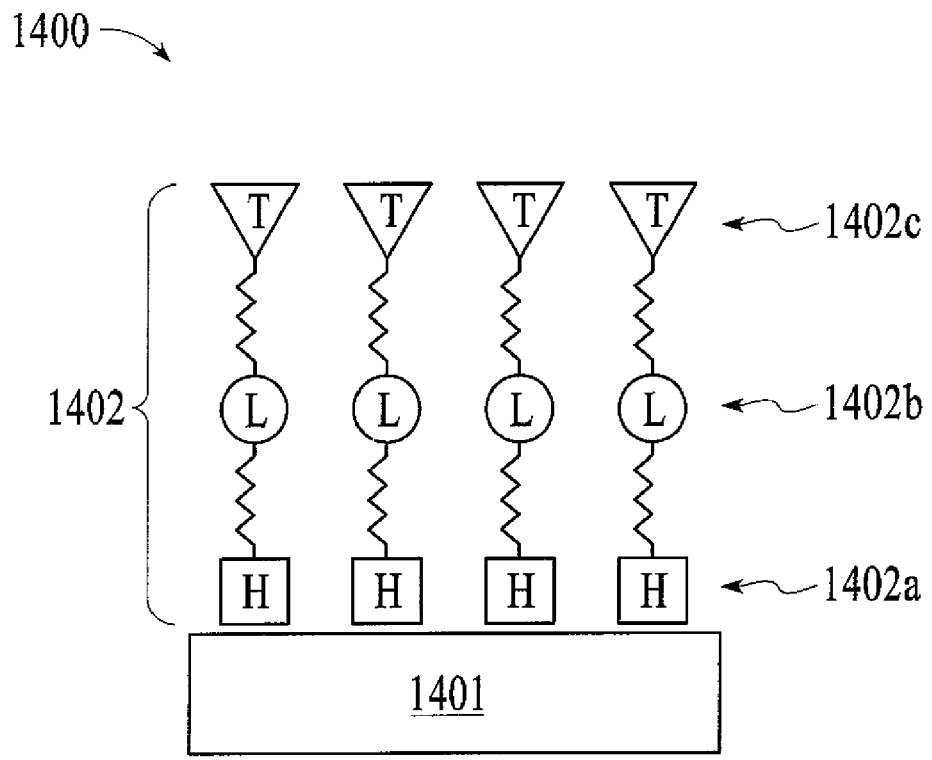
FIG. 14A is a cross-sectional view of a structure including a dielectric region on which is formed a masking layer.
Figure 14B:
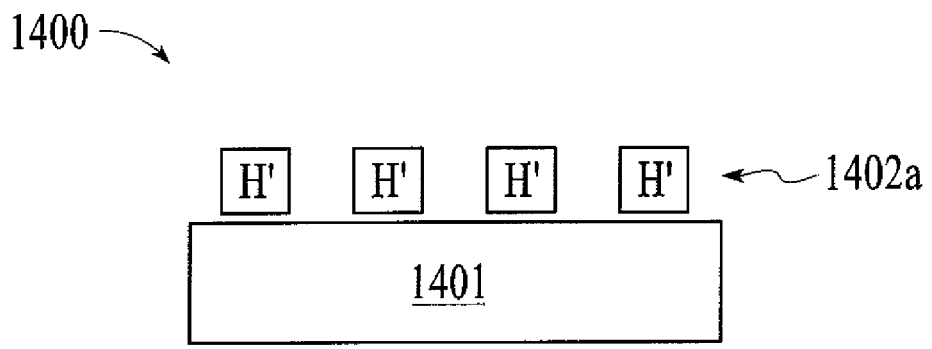
FIGS. 14B through 14D are cross-sectional views of the structure of FIG. 14A after further processing to modify the masking layer in a manner intended to produce desired characteristics of the masking layer, illustrating different approaches that can be used to modify the masking layer.
Figure 14C:
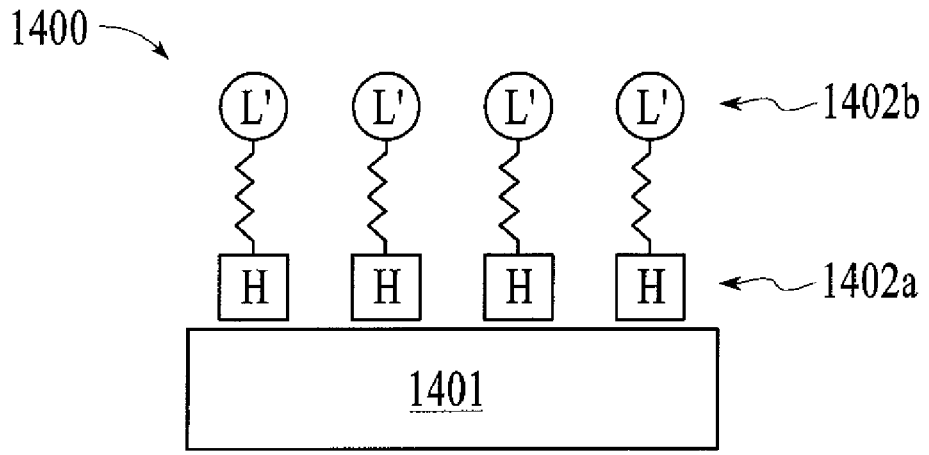
Figure 14D:
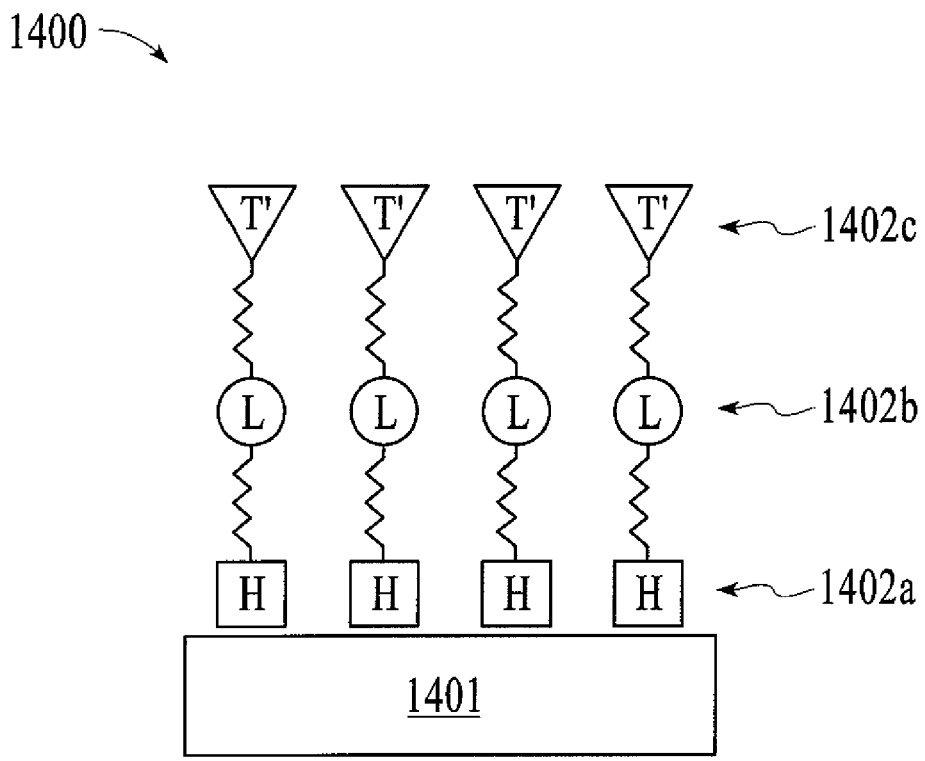

FIG. 14A is a cross-sectional view of a structure 1400 including a dielectric region 1401 on which is formed a masking layer 1402. The masking layer 1402 is a self-assembled monolayer (SAM). The SAM includes: 1) a head group 1402a formed on the dielectric region 1401, 2) a linking group 1402b connected to the head group 1402a, and 3) a terminal group 1402c, connected to the linking group 1402b, on which material can subsequently be formed. Without modification, the masking layer 1402 has characteristic(s), with respect to formation of material on the electronic device subsequent to formation of the masking layer, in accordance with the nature of the terminal group 1402c used in the masking layer 1402. FIGS. 14B through 14D are cross-sectional views of the structure 1400 after further processing to modify the masking layer 1402 in a manner intended to produce desired characteristics of the masking layer with respect to formation of material on the electronic device subsequent to formation of the masking layer (and, in particular, one or more characteristics that are different from those provided by the unmodified terminal group 1402c of the masking layer 1402), as discussed above. Each of FIGS. 14B through 14D illustrates a different general type of approach that can be used to modify the masking layer 1402. In FIG. 14B, the head group 1402a of the masking layer 1402 is cleaved, removing part of the head group 1402a, all of the linking group 1402b and all of the terminal group 1402c of the masking layer 1402; the part of the head group 1402a remaining on the dielectric region 1401 (designated as H= in FIG. 14B to indicate that characteristic(s) are provided that are different from those provided by the unmodified head group 1402a of FIG. 14A) provides the desired characteristic(s) for the masking layer 1402. In FIG. 14C, the linking group 1402b of the masking layer 1402 is cleaved, removing part of the linking group 1402b and all of the terminal group 1402c of the masking layer 1402; the part of the linking group 1402b remaining on the dielectric region 1401 (designated as L= in FIG. 14C to indicate that characteristic(s) are provided that are different from those provided by the unmodified linking group 1402b of FIG. 14A) provides the desired characteristic(s) for the masking layer 1402. In FIG. 14D, the terminal group 1402c of the masking layer 1402 is cleaved, removing part of the terminal group 1402c of the masking layer 1402; the part of the terminal group 1402c remaining on the dielectric region 1401 (designated as T= in FIG. 14D to indicate that characteristic(s) are provided that are different from those provided by the unmodified terminal group 1402c of FIG. 14A) provides the desired characteristic(s) for the masking layer 1402.

There are other general types of approaches, not illustrated in FIGS. 14B through 14D, that can be used to modify a masking layer. For example, in the structure 1400, the bond between the head group 1402a and the linking group 1402b could be broken, resulting in the removal of the linking group 1402b and the terminal group 1402c of the masking layer 1402; the head group 1402a remaining on the dielectric region 1401 provides the desired characteristic(s) for the masking layer 1402. Or, the bond between the linking group 1402b and the terminal group 1402c could be broken, resulting in the removal of the terminal group 1402c of the masking layer 1402; the linking group 1402b remaining on the dielectric region 1401 provides the desired characteristic(s) for the masking layer 1402. Or, the terminal group 1402c could be functionalized (rather than cleaved); the modified terminal group 1402c provides the desired characteristic(s) for the masking layer 1402. (In fact, in each of the other general types of approaches described above—i.e., cleaving the head group 1402a, linking group 1402b or terminal group 1402c, or breaking the bond between the head group 1402a and the linking group 1402b or between the linking group 1402b and the terminal group 1402c—the exposed part of the masking layer 1402 can be functionalized to produce desired characteristic(s).)

There are many particular ways in which the above-described general approaches to modifying a masking layer can be implemented. The particular implementation can depend on the particular structure and/or materials of the head group 1402a, linking group 1402b and/or terminal group 1402c of the masking layer 1402, and/or on the bond(s) formed there between. Those skilled in the art can appreciate how such general approaches may be particularly implemented using, for example, appropriate chemical or electrochemical processing, in view of the particular structure and/or materials of the head group 1402a, linking group 1402b and/or terminal group 1402c of the masking layer 1402, and/or the bond(s) formed there between, together with the description given above.

For example, it may be desired that the masking layer inhibit formation thereon of material used to form the capping layer and promote adhesion to material used to form a dielectric barrier layer. This can be accomplished by establishing the terminal group of a molecule used to form a molecularly self-assembled masking layer (e.g., a SAM)—i.e., specifying the molecule to include a particular terminal group, cleaving the terminal group of the molecule and/or functionalizing the terminal group—to inhibit formation of material used to form the capping layer and promote adhesion to material used to form a dielectric barrier layer, or by establishing the terminal group of a molecule used to form a molecularly self-assembled masking layer to inhibit formation of material used to form the capping layer, then modifying (i.e., cleaving and/or functionalizing) the terminal group to promote adhesion to material used to form a dielectric barrier layer. As discussed above, silane-based SAMs can be tailored to promote or inhibit the formation of particular material thereon, which can be useful in facilitating selective formation of a capping layer and/or promoting adhesion of a dielectric barrier layer formed on a masking layer. The properties of the exposed surface of a silane-based SAM can be controlled through use of appropriately substituted silane precursors. For example, a SAM formed from reaction of octadecyltrichlorosilane is expected to produce an exposed surface free of reactive functionality (i.e., saturated hydrocarbyl only). By contrast, a SAM formed from reaction of aminopropyltrimethoxysilane is expected to produce an exposed surface featuring a high density of amine functionality. The hydrocarbyl surface would be expected to provide a poor surface for nucleation of material formed using an electroless deposition process, while the amine-functionalized surface would be expected to promote such nucleation. More generally, silane precursors with alkyl, aryl, fluoroalkyl or fluoroaryl substituents can be used to produce an exposed surface free of reactive functionality (inhospitable for nucleation of material formed using an electroless deposition process), while exposed SAM surfaces containing reactive functionality such as hydroxyl, amino or carboxy groups (hospitable for nucleation of material formed using an electroless deposition process) can be produced through the use of appropriately substituted silane precursors, as can be appreciated by those skilled in the art. Thus, the exposed surface properties of a silane-based SAM can be controlled to inhibit formation of capping layer material on the SAM.

The characteristics of a masking layer can also be established (i.e., appropriate material(s) and/or process(es) used) to produce desired diffusion barrier properties. In particular, the characteristics of the masking layer can be established so that the masking layer provides a good barrier to diffusion of the capping layer material and/or material(s) used in the formation of the capping layer (e.g., precursor material(s)). Establishing the characteristics of the masking layer to inhibit diffusion can be increasingly advantageous as the porosity of dielectric material(s) used in an application of the invention increases. For example, it is anticipated that the invention will sometimes be implemented using a cobalt alloy (e.g., a cobalt-tungsten-phosphorous alloy) to form the capping layer. In that case, the characteristics of the masking layer can be established so that the masking layer provides a good barrier to diffusion of cobalt alloys and/or alloy precursors.

As discussed above (and as illustrated by FIGS. 4A and 4B, 5A and 5B, 6A and 6B, 7A and 7B, 8A and 8B, 9A and 9B, 10A and 10B, 11A and 11B, 12A and 12B, and 13A and 13B), the invention can be implemented so that a masking layer is formed non-selectively on both the dielectric region and electrically conductive regions, followed by removal of all masking layer material formed on the electrically conductive regions, leaving the masking layer formed only on the dielectric region. Any of a variety of appropriate processes can be used to remove masking layer material from electrically conductive regions, as known to those skilled in the art: the particular process used in an embodiment of the invention to remove masking layer material from electrically conductive regions can depend, in particular, on the characteristics of the masking layer material and the material used to form the electrically conductive regions. Removal of masking layer material formed on an electrically conductive region can be accomplished by, for example, use of a rinsing process to remove physi-absorbed masking layer material or by use of an etching process to remove a small part of the electrically conductive region at the top of the electrically conductive regions (and, thus, masking layer material formed thereon). Such process(es) may already be performed as part of the manufacture of the electronic device to remove other contaminants from the surfaces of the electrically conductive regions and the invention can advantageously make use of that processing to enhance the efficiency with which a masking layer is produced in implementations of the invention in which the masking layer is initially formed non-selectively.

As indicated above, in steps 303 through 306 of the method 300, after formation of the masking layer, a capping layer is formed on the electronic device so that the capping layer is formed on the electrically conductive regions, but not on or in the masking layer and/or the dielectric region. (Formation of a capping layer on an electrically conductive region encompasses negligible failure of the capping layer material to cover the electrically conductive region, i.e., capping layer material coverage failure that does not impair performance of a method according to the invention or the functionality of an electronic device in the production of which a method according to the invention is used.

Additionally, no formation of a capping layer on or in the masking layer and/or dielectric region encompasses negligible formation of capping layer material on or in the masking layer and/or dielectric region, i.e., capping layer material formation that does not impair performance of a method according to the invention or the functionality of an electronic device in the production of which a method according to the invention is used. In particular, negligible formation of capping layer material on or in the masking layer and/or dielectric region does not produce unacceptable current leakage between electrically conductive regions even if an electrically conductive material is used to form the capping layer. Unacceptable current leakage can mean current leakage that is worse than the current leakage between electrically conductive regions that occurs in an electronic device in which a dielectric barrier layer is formed over the electrically conductive regions and dielectric region, but no capping layer is formed over the electrically conductive regions.) As indicated by step 303, the capping layer can be formed selectively on the electrically conductive regions or the capping layer can be formed non-selectively on both the masking layer and the electrically conductive regions. (Selective formation of a capping layer on electrically conductive regions encompasses negligible formation of capping layer material on or in the masking layer and/or dielectric region, i.e., capping layer material coverage that does not impair performance of a method according to the invention or the functionality of an electronic device in the production of which a method according to the invention is used. Non-selective formation of a capping layer on both the masking layer and the electrically conductive regions encompasses formation of the capping layer with no preference for the electrically conductive regions or masking layer, with some degree of preference for the masking layer, or with preference for the electrically conductive regions that is inadequate to result in the formation of no or negligible capping layer material on or in the masking layer and/or dielectric region, i.e., in the last case, with preference that is inadequate to constitute selective formation of the capping layer on the electrically conductive regions.) When the capping layer is formed non-selectively on both the masking layer and the electrically conductive regions, all capping layer material formed on the masking layer is subsequently removed, as indicated by steps 304 and 305. (Removal of all capping layer material formed on the masking layer encompasses leaving negligible capping layer material formed on the masking layer, i.e., capping layer material coverage that does not impair performance of a method according to the invention or the functionality of an electronic device in the production of which a method according to the invention is used.) Each of FIGS. 4C, 5C, 6C and 7C illustrate selective formation of a capping layer 440 on the electrically conductive regions 410, while each of FIGS. 8C and 8D, 9C and 9D, 10C and 10D, 11C and 11D, 12C and 12D, and 13C and 13D illustrate non-selective formation of a capping layer 440 on both the masking layer 450 and the electrically conductive regions 410, followed by removal of all capping layer material formed on the masking layer 450, leaving the capping layer 440 formed only on the electrically regions 410.

In general, the capping layer can be formed using any material(s) and process(es) that produce a capping layer that achieves necessary or desirable functions of the capping layer, e.g., that inhibits electromigration in electrically conductive regions on which the capping layer is formed, that inhibits diffusion of material from electrically conductive regions on which the capping layer is formed. The material(s) and process(es) used can—and typically will—depend on whether the capping layer is to be formed selectively or not. The capping layer can be formed of an electrically conductive, semiconductor or electrically insulative (effectively non-conductive) material. (The use of a semiconductor or electrically insulative material can reduce or eliminate concern with formation of capping layer material on the masking layer that may otherwise produce unacceptable current leakage between the electrically conductive regions.) For example, materials (e.g., cobalt alloys, such as an alloy of cobalt, tungsten and phosphorous or an alloy of cobalt and boron; nickel alloys, such as an alloy of nickel, molybdenum and phosphorous; or tungsten) and processes (e.g., electroless deposition, chemical vapor deposition) that have previously been used to selectively deposit a capping layer on electrically conductive regions of a semiconductor device can be used; the presence of the masking layer on the dielectric region during formation of the capping layer, in accordance with the invention, inhibits formation of capping layer material on the dielectric region that may otherwise occur as a result of inadequate selectivity of those materials and processes, as discussed above. Other materials and processes can also be used: for example, the capping layer can be formed using tantalum or tantalum nitride, and the capping layer can be formed using other deposition processes, such as physical vapor deposition (sputtering) or atomic layer deposition. Like the masking layer, the capping layer can be functionalized in a desired manner (e.g., to produce desired adhesion properties of the capping layer with respect to a material to subsequently be formed thereon, such as a dielectric barrier layer).

The characteristics of a capping layer formed in an embodiment of the invention can be established to produce desired properties of the capping layer. The particular manner in which the characteristics of a capping layer are tailored (in turn, the material(s) and/or process(es) used to form the capping layer) can—and, it is anticipated, typically will—depend on the particular application of the invention, i.e., the characteristics and properties of the masking layer, electrically conductive regions, and/or subsequently formed material (e.g., dielectric barrier layer) of the electronic device in which the capping layer is to be formed. In particular, it can be desirable to establish the characteristics of the capping layer (i.e., use appropriate material(s) and/or process(es)) to facilitate strong adhesion to, and selective formation on, the electrically conductive regions, e.g., so that the capping layer nucleates better on the electrically conductive regions than on the masking layer. The above-described materials and processes for depositing an electrically conductive material produce a capping layer that nucleates better on the metallic materials (e.g., copper, aluminum) of which the electrically conductive regions are typically made than on the materials of which the masking layer is typically made, thus making them desirable for use in many applications of the invention.

The presence of the masking layer prevents formation of capping layer material on or in (through diffusion) the dielectric region, thus enforcing good selectivity of the capping layer material for the electrically conductive regions vis-a-vis the dielectric region regardless of the selectivity otherwise associated with the material(s) and process(es) used to form the capping layer. In this vein, the presence of the masking layer prevents residual electrically conductive material that may be left on the dielectric region after a planarization process (e.g., chemical mechanical polishing) from promoting undesired nucleation of capping layer material on the dielectric region, and also facilitates the use of porous dielectric materials that may otherwise be unacceptably susceptible to diffusion of capping layer material. Thus, the invention provides increased flexibility in the materials and processes that can be used to form the capping layer, since the above-described concerns that must be accommodated if no masking layer is present are alleviated. For example, as discussed above, the invention enables use of materials and processes for depositing an electrically conductive material to form a capping layer that have previously been inadequate to form a capping layer without producing unacceptable current leakage between electrically conductive regions, but that are effective in inhibiting electromigration because of good adhesion to electrically conductive regions.

Additionally, since the presence of the masking layer enables production of a capping layer by forming additional material on an electrically conductive region, there is no need to create a capping layer by chemically modifying a top part of the electrically conductive region. Thus, the undesirable increase in resistance in the electrically conductive region that is associated with creation of a capping layer in that manner is avoided.

Figure 8A:
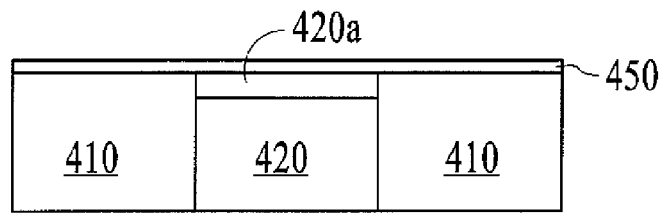
FIGS. 8A through 8E are a series of simplified cross-sectional views of a part of an electronic device, illustrating stages in the production, in accordance with another embodiment of the invention, of a capping layer on electrically conductive regions of the electronic device that are separated by a dielectric region.
Figure 8B:
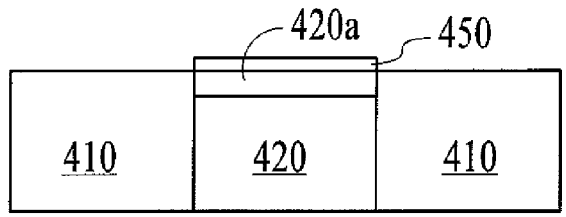
Figure 8C:
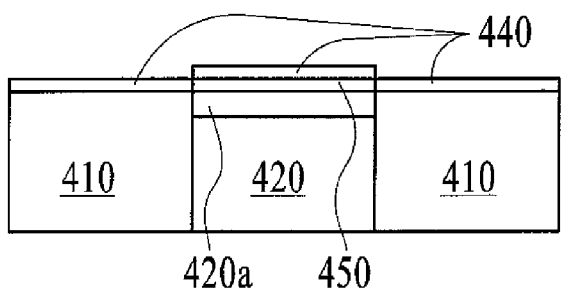
Figure 8D:
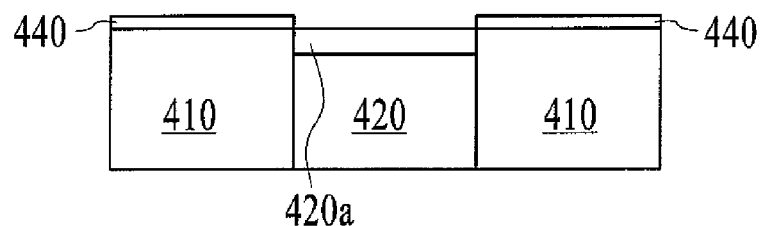
Figure 9A:
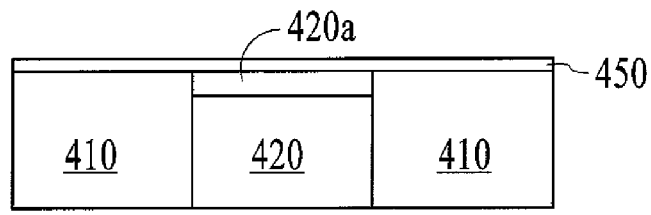
FIGS. 9A through 9D are a series of simplified cross-sectional views of a part of an electronic device, illustrating stages in the production, in accordance with another embodiment of the invention, of a capping layer on electrically conductive regions of the electronic device that are separated by a dielectric region.
Figure 9B:
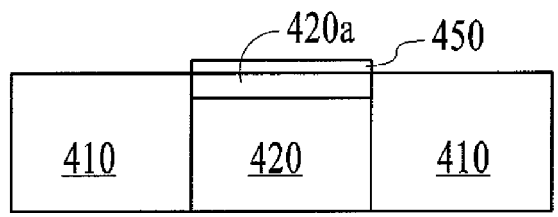
Figure 9C:
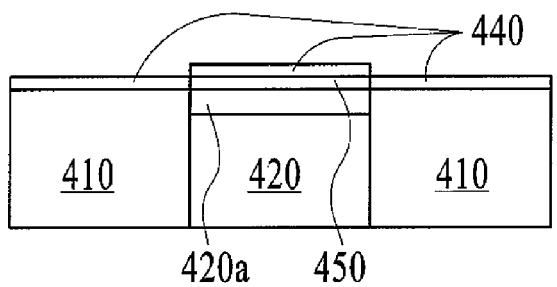
Figure 9D:
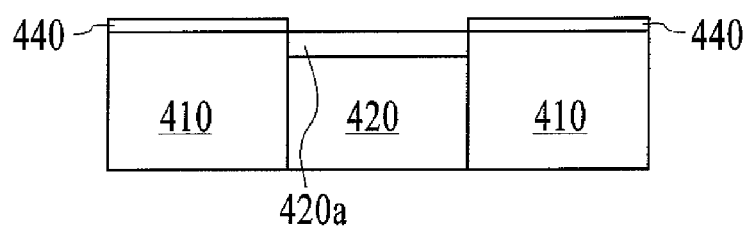

As indicated above, when the capping layer is formed non-selectively on both the masking layer and the electrically conductive regions, all capping layer material formed on the masking layer is subsequently removed, as indicated by steps 304 and 305, so that no (or negligible) capping layer material is present over the dielectric region, thus eliminating the possibility of current leakage between the electrically conductive regions when an electrically conductive material is used to form the capping layer. (In accordance with the usage herein of selective formation of a capping layer, as explained above, it is not necessary to remove capping layer material from the masking layer when the capping layer is selectively formed on the electrically conductive regions; however, even in that case, as a practical matter it may be desirable to implement the invention to remove capping layer material from the masking layer to ensure that potentially detrimental capping layer material is not formed on the masking layer.) This can be done by removing just the capping layer material from the masking layer (step 305), or by removing some (e.g., a top part on which the capping layer material is formed) or all of the masking layer together with the capping layer material formed thereon (step 304). FIGS. 10D, 11D, 12D and 13D illustrate removal of just capping layer material from the masking layer, while FIGS. 8D and 9D illustrate removal of all of the masking layer and the capping layer material formed thereon.

In general, any appropriate process(es) can be used to remove capping layer material from over the dielectric region. Typically, the removal process(es) include process step(s) that detach the capping layer material, or some or all of the masking layer together with the capping layer material, followed by rinsing steps that remove the detached material from the electronic device. The process(es) used can—and typically will—depend on whether only capping layer material is to be removed, some of the masking layer is to be removed together with the capping layer, or all of the masking layer is to be removed together with the capping layer. Additionally, process(es) used can depend on the characteristics and properties of the capping layer material, the masking layer and (particularly if all of the masking layer is to be removed) the material used to form the dielectric region. For example, a masking layer can be formed (or functionalized) so that a top part of the masking layer can be cleaved from the rest of the masking layer when subjected to appropriate processing, as described further below. Or, a molecularly self-assembled masking layer can be formed so that the organic backbone of the molecularly self-assembled masking layer can be broken down and removed when subjected to appropriate processing.

Figure 15A:
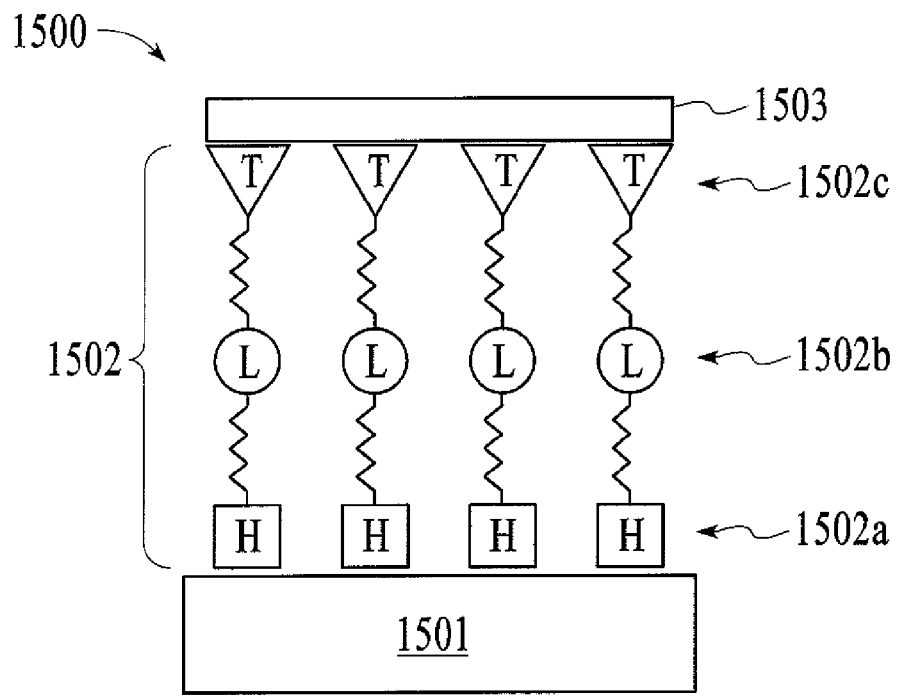
FIG. 15A is a cross-sectional view of a structure including a dielectric region on which is formed a masking layer, a capping layer being formed, in turn, on the masking layer.
Figure 15B:
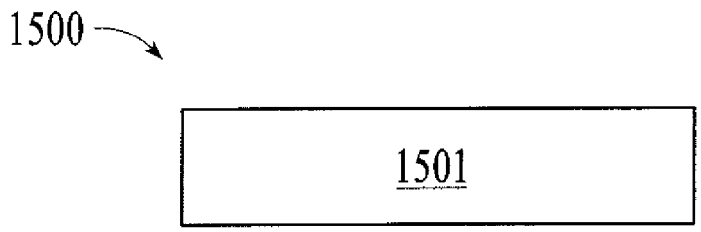
FIGS. 15B through 15E are cross-sectional views of the structure of FIG. 15A after further processing to remove the capping layer, illustrating different approaches that can be used to effect removal of the capping layer.
Figure 15C:
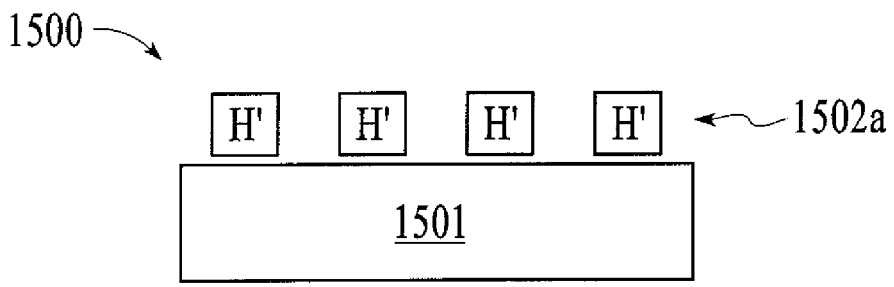
Figure 15D:
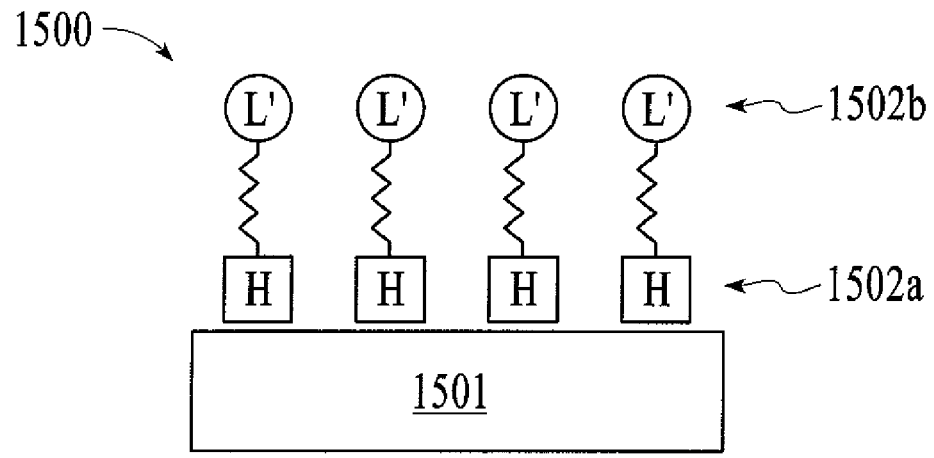
Figure 15E:
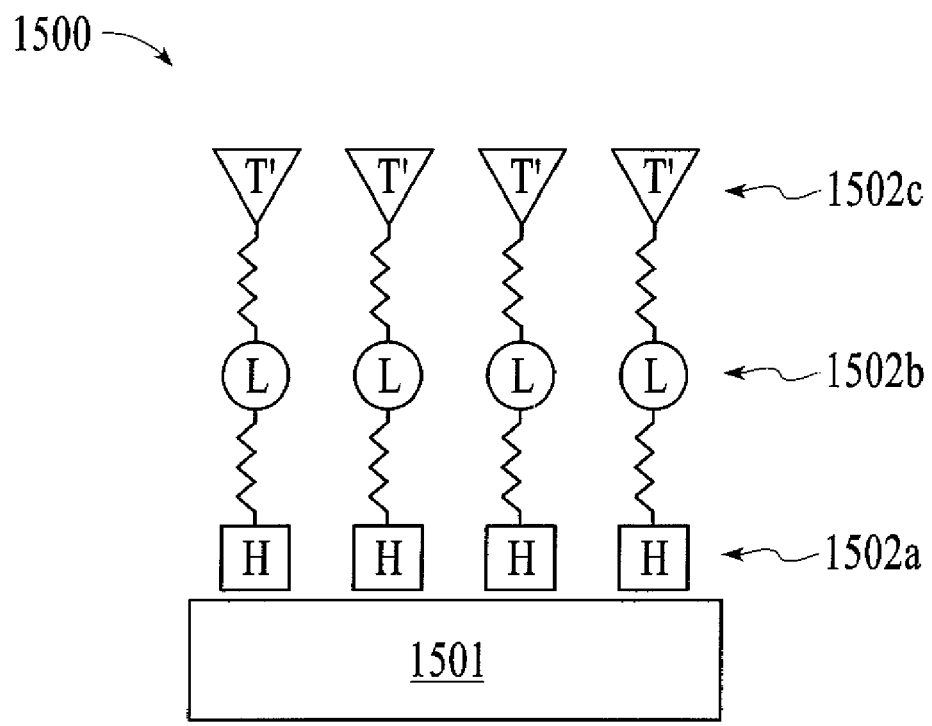

FIG. 15A is a cross-sectional view of a structure 1500 including a dielectric region 1501 on which is formed a masking layer 1502, a capping layer 1503 being formed, in turn, on the masking layer 1502. The masking layer 1502 is a self-assembled monolayer (SAM). The SAM includes: 1) a head group 1502a formed on the dielectric region 1501, 2) a linking group 1502b connected to the head group 1502a, and 3) a terminal group 1502c, connected to the linking group 1502b, on which material can subsequently be formed. FIGS. 15B through 15E are cross-sectional views of the structure 1500 after further processing to remove the capping layer 1503. Each of FIGS. 15B through 15E illustrates a different general type of approach that can be used to effect removal of a capping layer from over a dielectric region. In FIG. 15B, the entire masking layer 1502 is removed from the dielectric region 1501: as a consequence of removing the masking layer 1502, the capping layer 1503 is also removed from over the dielectric region 1501. In FIG. 15C, the head group 1502a of the masking layer 1502 is cleaved, removing part of the head group 1502a, all of the linking group 1502b and all of the terminal group 1502c of the masking layer 1502, together with the capping layer 1503 formed on the masking layer 1502 (the part of the head group 1502a remaining on the dielectric region 1501 is designated as H= in FIG. 15C to indicate difference from the unmodified head group 1502a of FIG. 15A). In FIG. 15D, the linking group 1502b of the masking layer 1502 is cleaved, removing part of the linking group 1502b and all of the terminal group 1502c of the masking layer 1502, together with the capping layer 1503 formed on the masking layer 1502 (the part of the linking group 1502b remaining on the dielectric region 1501 is designated as L= in FIG. 15D to indicate difference from the unmodified linking group 1502b of FIG. 15A). In FIG. 15E, the terminal group 1502c of the masking layer 1502 is cleaved, removing part of the terminal group 1502c of the masking layer 1502, together with the capping layer 1503 formed on the masking layer 1502 (the part of the terminal group 1502*c* remaining on the dielectric region 1501 is designated as T= in FIG. 15E to indicate difference from the unmodified terminal group 1502*c* of FIG. 15A).

There are other general types of approaches, not illustrated in FIGS. 15B through 15E, that can be used to effect removal of a capping layer from over a dielectric region. For example, in the structure 1500, the bond between the head group 1502*a* and the linking group 1502*b* could be broken, resulting in the removal of the linking group 1502*b* and the terminal group 1502*c* of the masking layer 1502, together with the capping layer 1503 formed on the masking layer 1502. Or, the bond between the linking group 1502*b* and the terminal group 1502*c* could be broken, resulting in the removal of the terminal group 1502*c* of the masking layer 1502, together with the capping layer 1503 formed on the masking layer 1502. Or, the capping layer 1503 may be removed from the masking layer 1502 without affecting the structure of the masking layer 1502, i.e., so that the terminal group 1502*c*, the linking group 1502*b* and the head group 1502*a* are not cleaved and the bonds there between are not broken. Finally, two or more of the above-described general approaches can be combined; this may be desirable to increase the likelihood that the capping layer 1502 is adequately removed from over the dielectric region 1501. Additionally, in any of the general types of approaches described above in which at least part of the masking layer 1502 remains on the dielectric region 1501 after removal of the capping layer 1503, the exposed part of the masking layer 1502 can be functionalized to produce desired characteristic(s) (this is true for any type of masking layer in accordance with the invention, not only the masking layer 1502).

There are many particular ways in which the above-described general approaches to effecting removal of a capping layer from over a dielectric region can be implemented. The particular implementation can depend on the particular structure and/or materials of the head group 1502*a*, linking group 1502*b* and/or terminal group 1502*c* of the masking layer 1502, the structure and/or materials of the capping layer 1503, and/or on the bond(s) formed there between. Those skilled in the art can appreciate how such general approaches may be particularly implemented using, for example, appropriate chemical or electrochemical processing, in view of the particular structure and/or materials of the head group 1502*a*, linking group 1502*b* and/or terminal group 1502*c* of the masking layer 1502, the structure and/or materials of the capping layer 1503, and/or the bond(s) formed there between, together with the description given above.

Figure 10A:
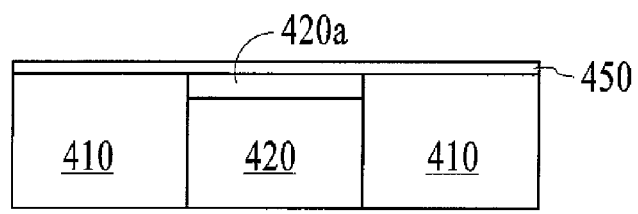
FIGS. 10A through 10F are a series of simplified cross-sectional views of a part of an electronic device, illustrating stages in the production, in accordance with another embodiment of the invention, of a capping layer on electrically conductive regions of the electronic device that are separated by a dielectric region.
Figure 10B:
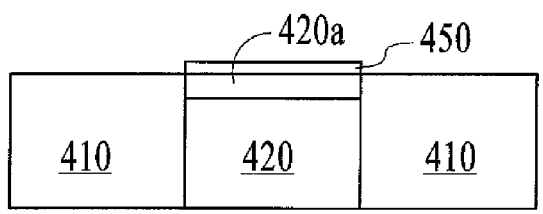
Figure 10C:
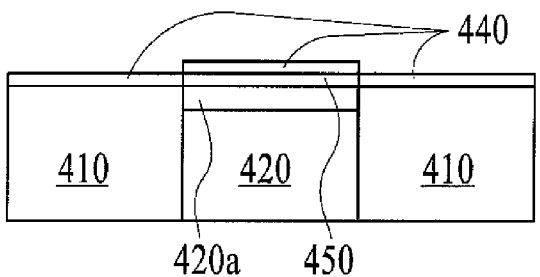
Figure 10D:
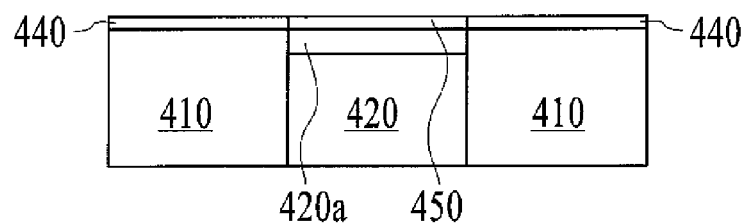
Figure 10E:
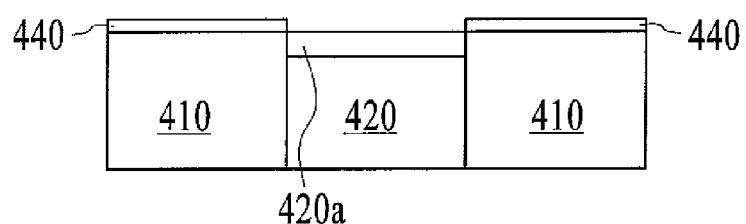
Figure 11A:
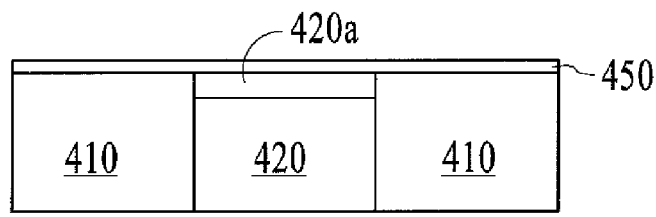
FIGS. 11A through 11E are a series of simplified cross-sectional views of a part of an electronic device, illustrating stages in the production, in accordance with another embodiment of the invention, of a capping layer on electrically conductive regions of the electronic device that are separated by a dielectric region.
Figure 11B:
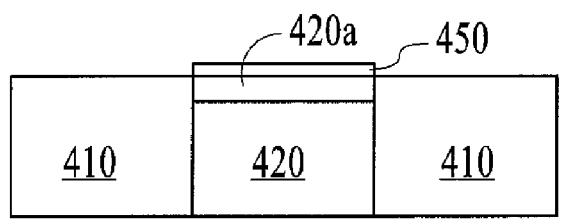
Figure 11C:
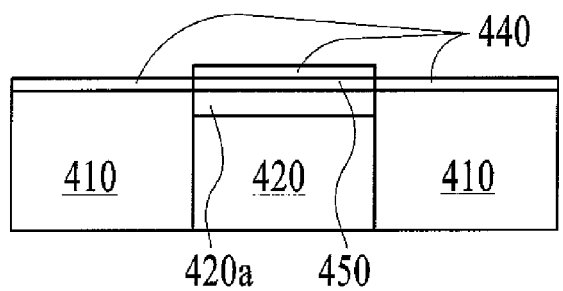
Figure 11D:
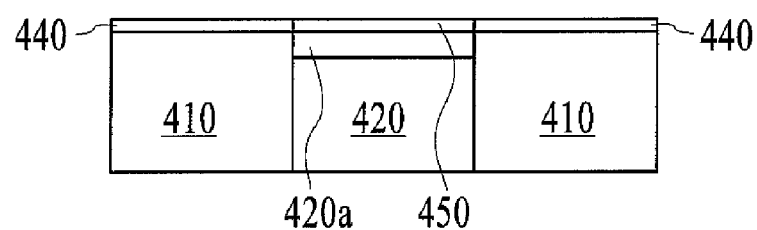
Figure 11E:
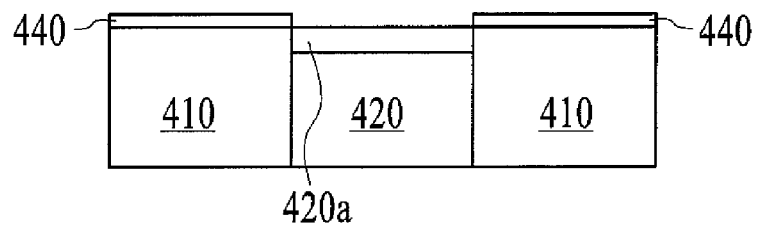

If the capping layer is formed selectively on the electrically conductive regions in step 303 or if, when the capping layer is formed non-selectively on the electrically conductive regions in step 303, only capping layer material is removed from the masking layer in steps 304 and 305, the method 300 further provides in step 306 for the possibility of subsequently removing all of the masking layer or modifying (i.e., removing some and/or functionalizing) the masking layer. Removing all of, or modifying, the masking layer may be necessary or desirable to produce a surface (i.e., an exposed surface of the masking layer or the dielectric region) having desired characteristics (e.g., good propensity for adhesion to a dielectric barrier layer subsequently to be formed on the masking layer). In the latter case (i.e., first removing the capping layer, then removing or modifying the masking layer), it may be necessary or desirable to remove some or all of the masking layer (and/or to functionalize the masking layer) after removing the capping layer (rather than together with removal of the capping layer) for one or more of a variety of reasons: in particular, it may be easier, more likely or only possible to produce a surface having desired characteristics by first removing the capping layer, then performing further processing to remove or modify the masking layer. FIGS. 10E and 11E illustrate removal of all of a masking layer from a dielectric region after capping layer material has been removed from the masking layer. FIGS. 14B through 14D illustrate removal of some of a masking layer and/or functionalization of the masking layer where the masking layer is a self-assembled monolayer (such removal or functionalization can also be performed for other types of masking layer).

Any of a variety of appropriate processes can be used to remove masking layer material from the dielectric region, as known to those skilled in the art. Similarly, any of a variety of appropriate processes can be used to functionalize a masking layer, as known to those skilled in the art. For example, removal of all of a masking layer formed on a dielectric region can be accomplished using a process or processes similar to those used to remove masking layer material from electrically conductive regions, as discussed above, e.g., rinsing process(es) and/or etching process(es). Likewise, removal of part of a masking layer formed on a dielectric region can be accomplished using a process or processes as described above for removal of part of a masking layer formed on a dielectric region prior to forming a capping layer. Or, removal of some or all of a masking layer after removal of the capping layer from the masking layer can be accomplished using a process or processes that are the same as, or similar to, process(es) used to remove some or all of a masking layer together with a capping layer formed thereon (however, the presence of the capping layer may make necessary or desirable the use of different process(es)). The particular process or processes used in an embodiment of the invention to remove masking layer material from the dielectric region and/or to functionalize the masking layer can depend, in particular, on the characteristics of the masking layer material, and may also depend on the material used to form the dielectric region.

As indicated above, in step 307 of the method 300, a dielectric barrier layer can be formed on the electronic device or not, depending on the properties of the capping layer. Each of FIGS. 4E, 6D, 8E, 10F and 12E illustrate formation of a dielectric barrier layer 430 on the electronic device, while each of FIGS. 5D, 7C, 9D, 11E and 13D illustrate no formation of a dielectric barrier layer on the electronic device.

If a dielectric barrier layer is formed on the electronic device, such formation can be accomplished using any conventional material(s) and process(es), or in any other appropriate manner, as known to those skilled in the art. For example, a dielectric barrier layer can be produced by using chemical vapor deposition to deposit silicon nitride or silicon carbide (e.g., a Barrier Low-K Dielectric) on the electronic device.

As discussed above, a dielectric barrier layer has been formed on electrically conductive material (e.g., copper) of an electronic device to inhibit diffusion of the electrically conductive material into adjacent material (e.g., dielectric material subsequently formed over the electrically conductive material) of the electronic device. However, if a capping layer can be formed of a material that provides good inhibition of such diffusion, while still providing other required properties of the capping layer (such as good adhesion to electrically conductive regions to inhibit electromigration, and good selectivity for electrically conductive regions so that, when the capping layer material is electrically conductive, stray capping layer material will not produce unacceptable current leakage between electrically conductive regions), it may be possible to eliminate the dielectric barrier layer from the electronic device or, at least, reduce the thickness of the dielectric barrier layer. In some embodiments of the invention, a capping layer is formed so that diffusion of material from the electrically conductive regions into adjacent regions is inhibited with sufficient effectiveness that the dielectric barrier layer can be formed with a smaller thickness than would be the case if the capping layer was not present. In other embodiments of the invention, a capping layer is formed so that diffusion of material from the electrically conductive regions into adjacent regions is inhibited with sufficient effectiveness that a dielectric barrier layer need not be formed. In either case, inhibiting diffusion of material from the electrically conductive regions into adjacent regions with sufficient effectiveness can mean that such diffusion is inhibited (together with inhibition of such diffusion by a reduced-thickness dielectric barrier layer, if present) as well as, or better than, such diffusion would be inhibited by a dielectric barrier layer without the presence of the capping layer. For example, materials described above for use in forming a capping layer in accordance with invention, such as cobalt alloys, nickel alloys, tungsten, tantalum and tantalum nitride, can be formed in accordance with process(es) that enable the stoichiometry, thickness and density of the capping layer to be controlled to produce a capping layer that inhibits diffusion of material from the electrically conductive regions into adjacent regions with sufficient effectiveness that the dielectric barrier can be eliminated or reduced in thickness. Eliminating the dielectric barrier layer or reducing the thickness of the dielectric barrier layer reduces capacitance, which can decrease the power consumption and/or increase speed of operation of the electronic device. By using a masking layer on the dielectric region to minimize or eliminate selectivity as an important consideration in choosing material(s) and/or process(es) for forming the capping layer, the invention opens up new possibilities for those material(s) and/or process(es) that can enable formation of a capping layer that provides, in addition to adequate inhibition of electromigration, a good barrier to diffusion of electrically conductive material that can enable elimination or reduction in thickness of a conventional dielectric barrier layer, with attendant benefits.

Figure 4A:
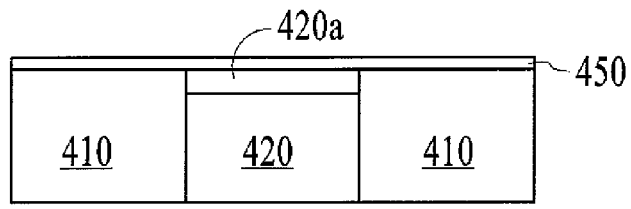
FIGS. 4A through 4E are a series of simplified cross-sectional views of a part of an electronic device, illustrating stages in the production, in accordance with an embodiment of the invention, of a capping layer on electrically conductive regions of the electronic device that are separated by a dielectric region.
Figure 4B:
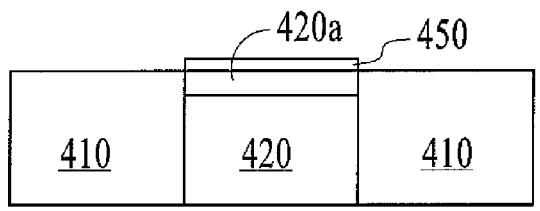
Figure 4C:
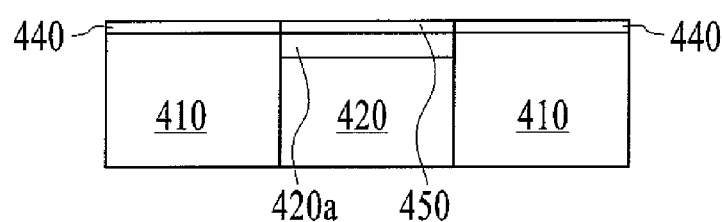
Figure 4D:
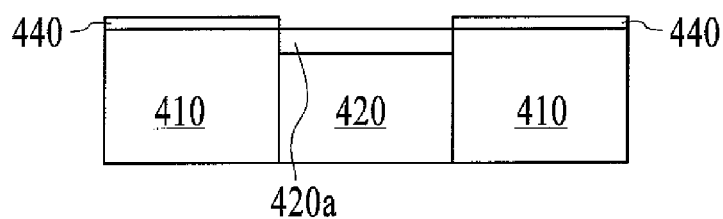
Figure 4E:
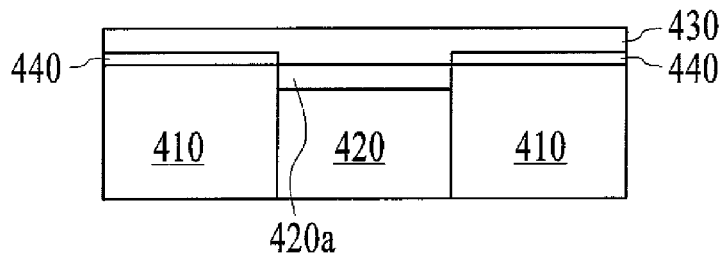
Figure 5A:
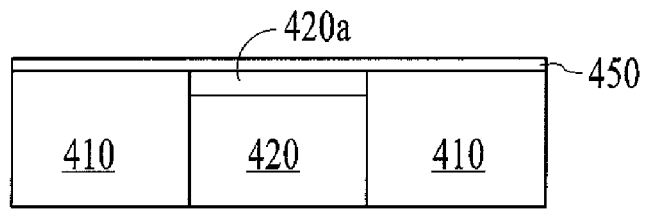
FIGS. 5A through 5D are a series of simplified cross-sectional views of a part of an electronic device, illustrating stages in the production, in accordance with another embodiment of the invention, of a capping layer on electrically conductive regions of the electronic device that are separated by a dielectric region.
Figure 5B:
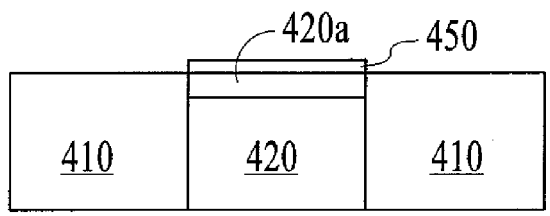
Figure 5C:
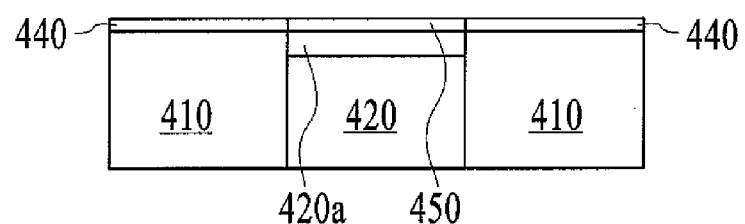
Figure 5D:
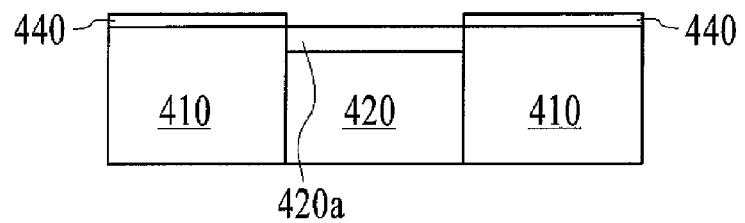
Figure 6A:
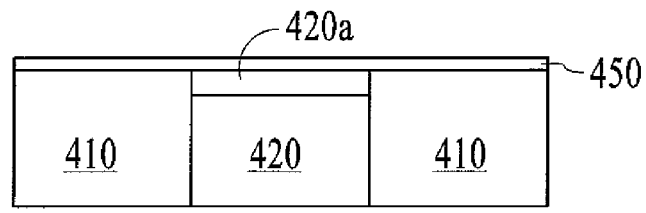
FIGS. 6A through 6D are a series of simplified cross-sectional views of a part of an electronic device, illustrating stages in the production, in accordance with another embodiment of the invention, of a capping layer on electrically conductive regions of the electronic device that are separated by a dielectric region.
Figure 6B:
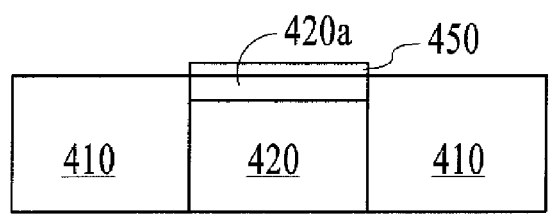
Figure 6C:
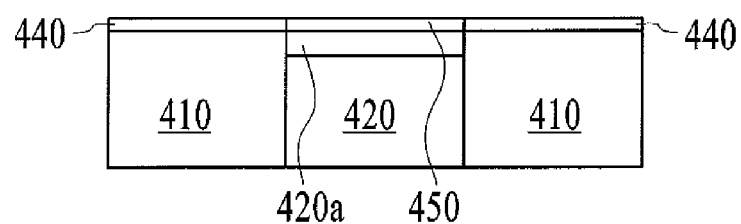
Figure 6D:
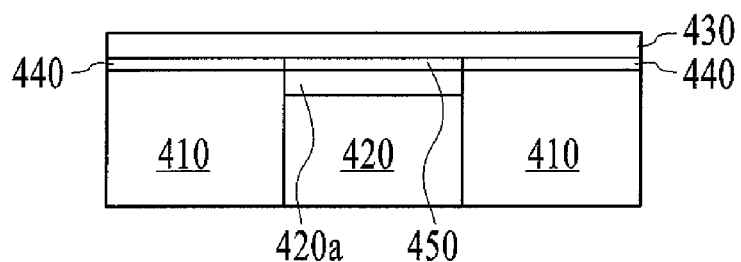
Figure 7A:
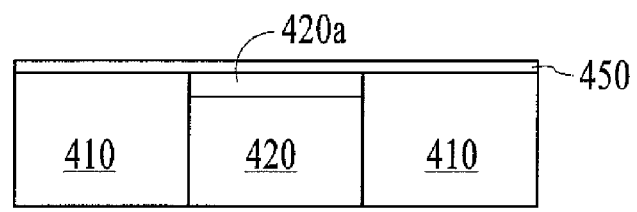
FIGS. 7A through 7C are a series of simplified cross-sectional views of a part of an electronic device, illustrating stages in the production, in accordance with another embodiment of the invention, of a capping layer on electrically conductive regions of the electronic device that are separated by a dielectric region.
Figure 7B:
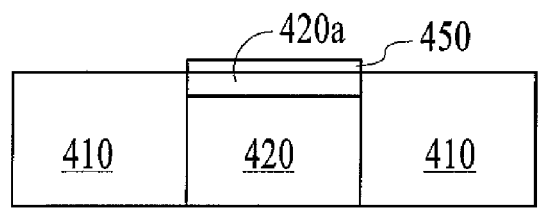
Figure 7C:
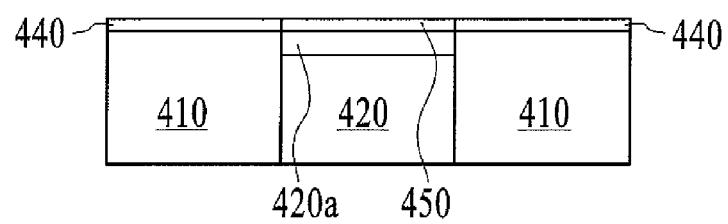
Figure 8E:
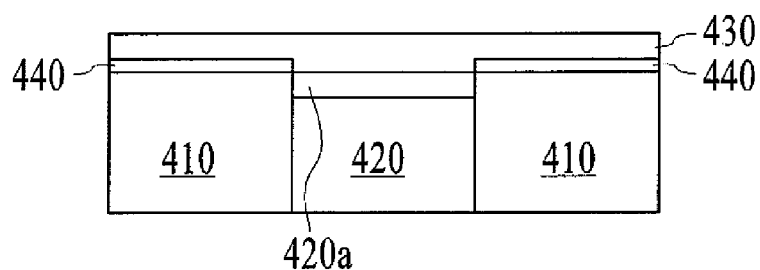
Figure 10F:
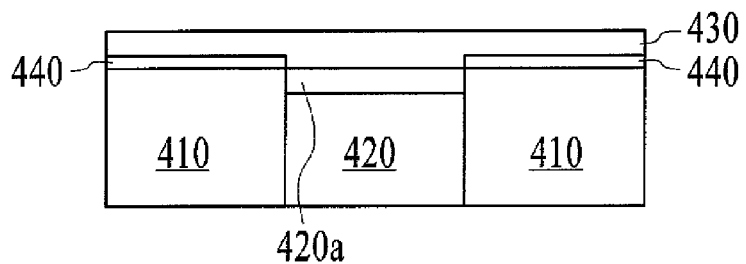
Figure 12A:
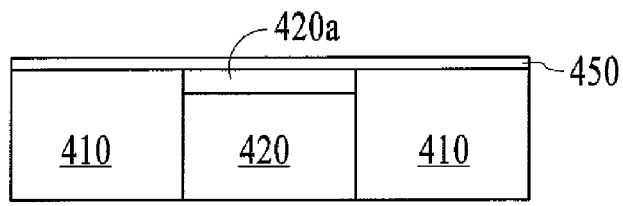
FIGS. 12A through 12E are a series of simplified cross-sectional views of a part of an electronic device, illustrating stages in the production, in accordance with another embodiment of the invention, of a capping layer on electrically conductive regions of the electronic device that are separated by a dielectric region.
Figure 12B:
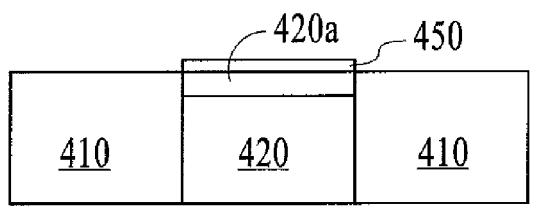
Figure 12C:
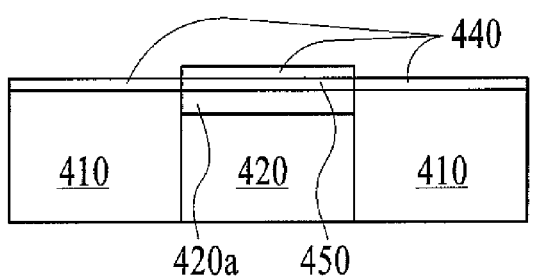
Figure 12D:
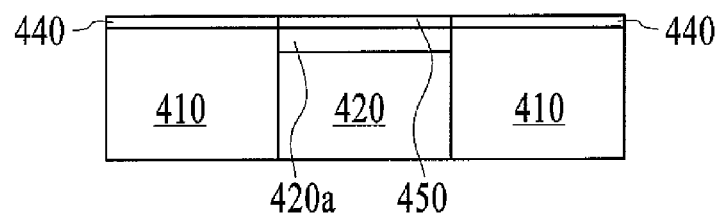
Figure 12E:
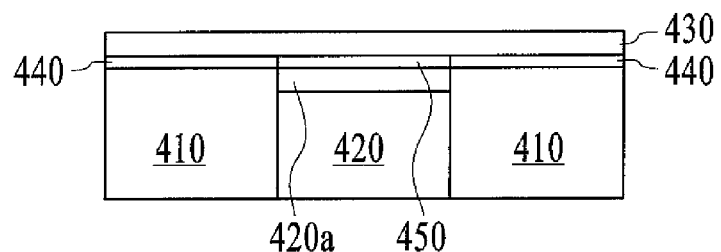
Figure 13A:
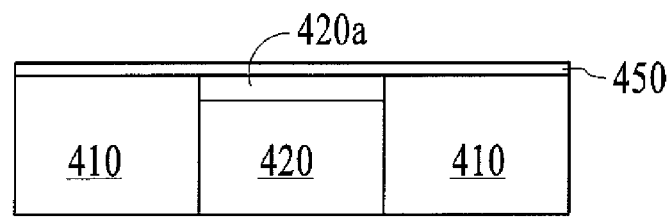
FIGS. 13A through 13D are a series of simplified cross-sectional views of a part of an electronic device, illustrating stages in the production, in accordance with another embodiment of the invention, of a capping layer on electrically conductive regions of the electronic device that are separated by a dielectric region.
Figure 13B:
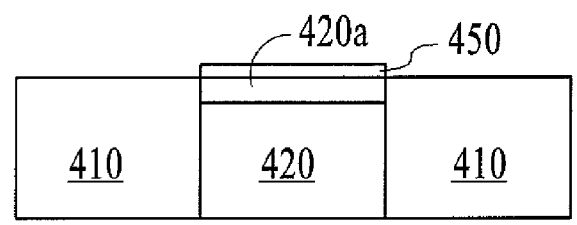
Figure 13C:
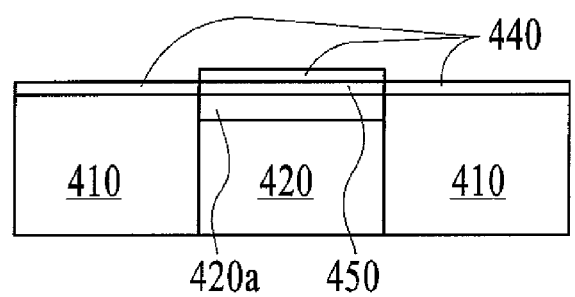
Figure 13D:
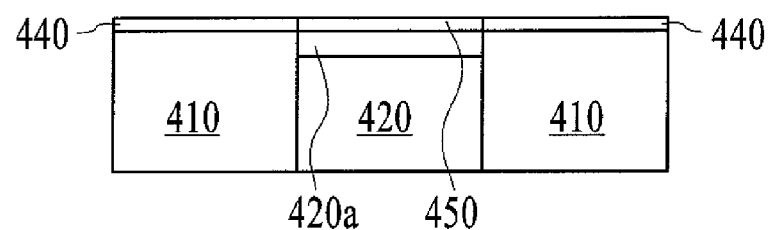

FIG. 3 illustrates a method, according to an embodiment of the invention, for producing a capping layer that includes various optional steps. FIGS. 4A through 4E, 5A through 5D, 6A through 6D, 7A through 7C, 8A through 8E, 9A through 9D, 10A through 10F, 11A through 11E, 12A through 12E, and 13A through 13D each illustrate the production, in accordance with various embodiments of the invention, of a capping layer. A capping layer in accordance with each of the embodiments of the invention illustrated by FIGS. 4A through 4E, 5A through 5D, 6A through 6D, 7A through 7C, 8A through 8E, 9A through 9D, 10A through 10F, 11A through 11E, 12A through 12E, and 13A through 13D is produced using the method 300 as follows. In the embodiment of the invention illustrated in FIGS. 4A through 4E, a masking layer 450 is formed non-selectively on both the dielectric region 420 and the electrically conductive regions 410 in the step 301 of the method 300 (FIG. 4A), all masking layer material is removed from the electrically conductive regions 410 in the step 302 of the method 300 (FIG. 4B), capping layer material is formed selectively on the electrically conductive regions 410 in the step 303 of the method 300 (FIG. 4C), all masking layer material is removed from the dielectric region 420 in the step 306 of the method 300 (FIG. 4D), and a dielectric barrier layer 430 is formed over the capping layer 440 and dielectric region 420 in the step 307 of the method 300 (FIG. 4E). In the embodiment of the invention illustrated in FIGS. 5A through 5D, each of the structures illustrated in FIGS. 5A through 5D are formed as described above for the structures illustrated in FIGS. 4A through 4D, respectively; unlike the embodiment of the invention illustrated in FIGS. 4A through 4E, in the embodiment of the invention illustrated in FIGS. 5A through 5D, the capping layer 440 is formed so that no dielectric barrier layer need be formed in the step 307 of the method 300. In the embodiment of the invention illustrated in FIGS. 6A through 6D, each of the structures illustrated in FIGS. 6A through 6C are formed as described above for the structures illustrated in FIGS. 4A through 4C, respectively; unlike the embodiment of the invention illustrated in FIGS. 4A through 4E, in the embodiment of the invention illustrated in FIGS. 6A through 6D, the masking layer material is not removed from the dielectric region 420 in the step 306 of the method 300 before forming a dielectric barrier layer 430 in the step 307 of the method 300 (FIG. 6D). In the embodiment of the invention illustrated in FIGS. 7A through 7C, each of the structures illustrated in FIGS. 7A through 7C are formed as described above for the structures illustrated in FIGS. 6A through 6C, respectively; unlike the embodiment of the invention illustrated in FIGS. 6A through 6D, in the embodiment of the invention illustrated in FIGS. 7A through 7C, the capping layer 440 is formed so that no dielectric barrier layer need be formed in the step 307 of the method 300. In the embodiment of the invention illustrated in FIGS. 8A through 8E, a masking layer 450 is formed non-selectively on both the dielectric region 420 and the electrically conductive regions 410 in the step 301 of the method 300 (FIG. 8A), all masking layer material is removed from the electrically conductive regions 410 in the step 302 of the method 300 (FIG. 8B), capping layer material is formed non-selectively on both the dielectric region 420 and the electrically conductive regions 410 in the step 303 of the method 300 (FIG. 8C), all masking layer material (and all capping layer material formed thereon) is removed from the dielectric region 420 in the step 304 of the method 300 (FIG. 8D), and a dielectric barrier layer 430 is formed over the capping layer 440 and dielectric region 420 in the step 307 of the method 300 (FIG. 8E). In the embodiment of the invention illustrated in FIGS. 9A through 9D, each of the structures illustrated in FIGS. 9A through 9D are formed as described above for the structures illustrated in FIGS. 8A through 8D, respectively; unlike the embodiment of the invention illustrated in FIGS. 8A through 8E, in the embodiment of the invention illustrated in FIGS. 9A through 9D, the capping layer 440 is formed so that no dielectric barrier layer need be formed in the step 307 of the method 300. In the embodiment of the invention illustrated in FIGS. 10A through 10F, each of the structures illustrated in FIGS. 10A through 10C are formed as described above for the structures illustrated in FIGS. 8A through 8C, respectively; unlike the embodiment of the invention illustrated in FIGS. 8A through 8E, in the embodiment of the invention illustrated in FIGS. 10A through 10F, masking layer material is not removed from the dielectric region 420 in the step 304 of the method 300, though all of the capping layer material is removed in the step 305 of the method 300 (FIG. 10D), after which all of the masking layer material is removed from the dielectric region 420 in the step 306 of the method 300 (FIG. 10E) followed by formation of a dielectric barrier layer 430 on the capping layer 440 and dielectric region 420 in the step 307 of the method 300 (FIG. 10F). In the embodiment of the invention illustrated in FIGS. 11A through 11E, each of the structures illustrated in FIGS. 11A through 11E are formed as described above for the structures illustrated in FIGS. 10A through 10E, respectively; unlike the embodiment of the invention illustrated in FIGS. 10A through 10F, in the embodiment of the invention illustrated in FIGS. 11A through 11E, the capping layer 440 is formed so that no dielectric barrier layer need be formed in the step 307 of the method 300. In the embodiment of the invention illustrated in FIGS. 12A through 12E, each of the structures illustrated in FIGS. 12A through 12D are formed as described above for the structures illustrated in FIGS. 10A through 10D, respectively; unlike the embodiment of the invention illustrated in FIGS. 10A through 10F, in the embodiment of the invention illustrated in FIGS. 12A through 12E, masking layer material is not removed from the dielectric region 420 in the step 306 of the method 300 before forming a dielectric barrier layer 430 in the step 307 of the method 300 (FIG. 12E). In the embodiment of the invention illustrated in FIGS. 13A through 13D, each of the structures illustrated in FIGS. 13A through 13D are formed as described above for the structures illustrated in FIGS. 12A through 12E, respectively; unlike the embodiment of the invention illustrated in FIGS. 12A through 12E, in the embodiment of the invention illustrated in FIGS. 13A through 13D, the capping layer 440 is formed so that no dielectric barrier layer need be formed in the step 307 of the method 300.

Various embodiments of the invention have been described. The descriptions are intended to be illustrative, not limiting. Thus, it will be apparent to one skilled in the art that certain modifications may be made to the invention as described herein without departing from the scope of the claims set out below.

We claim:

1. A method for producing a capping layer on electrically conductive regions of an electronic device that are separated by dielectric regions of the electronic device comprising:
   a) treating at least the dielectric regions to functionalize the dielectric regions;
   b) selectively depositing a molecularly self-assembled masking layer on the dielectric regions, wherein the molecularly self-assembled masking layer has a structure comprising a chain formed of different functionalities;
   c) modifying the molecularly self-assembled masking layer by removing a portion of the chain to expose a functionality; and
   d) forming a capping layer on at least the electrically conductive regions.

2. The method of claim 1 wherein the capping layer is selectively formed on the electrically conductive regions.

3. The method of claim 2 further comprising, removing the masking layer after the capping layer has been formed.

4. The method of claim 1 wherein the capping layer is formed on both the electrically conductive regions and the dielectric regions.

5. The method of claim 4 wherein the capping layer is subsequently removed from the masking layer.

6. The method of claim 4 wherein the capping layer and masking layer are subsequently removed from the dielectric regions.

7. The method of claim 1 wherein the capping layer is formed on the masking layer, the method further comprising:
   e) detaching at least the capping layer from the dielectric regions;
   f) rinsing the electronic device to remove the detached materials.

8. The method of claim 7 wherein the capping layer and at least a portion of the masking layer are detached from the dielectric regions.

9. The method of claim 1, wherein removing a portion of the chain to expose the functionality comprises cleaving a group of the chain.

10. The method of claim 1, wherein removing a portion of the chain to expose the functionality comprises breaking of a bond of the chain.

11. The method of claim 1, wherein the capping layer is deposited by electroless deposition and the molecularly self-assembled masking layer having an exposed functionality comprises a silane based material having a saturated hydrocarbyl surface free of reactive functionality to electroless deposition of the capping layer.

12. The method of claim 1, wherein the chain formed of different functionalities comprises a head group, a linking group, and a terminal group and wherein removing the portion of the chain to expose a functionality comprises exposing the linking group or the terminal group.

13. The method of claim 12 wherein the capping layer is formed on the masking layer, the method further comprising:
   e) detaching the capping layer from the dielectric regions by cleaving the head group, the linking group, or the terminal group;
   f) rinsing the electronic device to remove the detached materials.

* * * * *